(12) United States Patent
Chang et al.

(10) Patent No.: US 9,777,364 B2
(45) Date of Patent: Oct. 3, 2017

(54) ORGANIC LAYER DEPOSITION APPARATUS AND METHOD OF MANUFACTURING ORGANIC LIGHT-EMITTING DISPLAY DEVICE BY USING THE SAME

(71) Applicant: SAMSUNG DISPLAY CO., LTD., Yongin-si, Gyeonggi-do (KR)

(72) Inventors: Seok-Rak Chang, Yongin-si (KR); Myeng-Woo Nam, Yongin-si (KR); Hee-Cheol Kang, Yongin-si (KR); Jong-Heon Kim, Yongin-si (KR); Jong-Won Hong, Yongin-si (KR); Uno Chang, Yongin-si (KR)

(73) Assignee: Samsung Display Co., Ltd., Yongin-si (KR)

(*) Notice: Subject to any disclaimer, the term of this patent is extended or adjusted under 35 U.S.C. 154(b) by 0 days.

(21) Appl. No.: 15/179,677

(22) Filed: Jun. 10, 2016

(65) Prior Publication Data

US 2016/0293472 A1 Oct. 6, 2016

Related U.S. Application Data

(62) Division of application No. 13/492,144, filed on Jun. 8, 2012, now Pat. No. 9,512,515.

(30) Foreign Application Priority Data

Jul. 4, 2011 (KR) .................. 10-2011-0066124

(51) Int. Cl.
  *B65G 35/00* (2006.01)
  *C23C 14/12* (2006.01)
  (Continued)

(52) U.S. Cl.
  CPC .......... *C23C 14/12* (2013.01); *B05B 13/0221* (2013.01); *B05B 15/045* (2013.01);
  (Continued)

(58) Field of Classification Search
  CPC ...................... B05B 13/0221; B05B 13/0235
  (Continued)

(56) References Cited

U.S. PATENT DOCUMENTS 4,416,217 A 11/1983 Nakamura et al.
4,468,648 A 8/1984 Uchikune
(Continued)

FOREIGN PATENT DOCUMENTS

CN 1476279 A 2/2004
CN 1556872 A 12/2004
(Continued)

OTHER PUBLICATIONS

U.S. Office Action dated Dec. 31, 2015, for U.S. Appl. No. 14/012,924 (10 sheets).
(Continued)

*Primary Examiner* — Lex Malsawma
*Assistant Examiner* — Eric W Jones
(74) *Attorney, Agent, or Firm* — Lewis Roca Rothgerber Christie LLP

(57) ABSTRACT

An organic layer deposition apparatus, and a method of manufacturing an organic light-emitting display device using the organic layer deposition apparatus. The organic layer deposition apparatus includes: an electrostatic chuck that fixedly supports a substrate that is a deposition target; a deposition unit including a chamber maintained at a vacuum and an organic layer deposition assembly for depositing an organic layer on the substrate fixedly supported by the electrostatic chuck; and a first conveyor unit for moving the electrostatic chuck fixedly supporting the substrate into the
(Continued)

deposition unit, wherein the first conveyor unit passes through inside the chamber, and the first conveyor unit includes a guide unit having a receiving member for supporting the electrostatic chuck to be movable in a direction.

18 Claims, 11 Drawing Sheets

(51) Int. Cl.
    *C23C 14/50* (2006.01)
    *H01L 21/67* (2006.01)
    *H01L 21/677* (2006.01)
    *H01L 21/683* (2006.01)
    *B05B 13/02* (2006.01)
    *B05B 15/04* (2006.01)
    *B05D 1/00* (2006.01)
    *C23C 14/04* (2006.01)
    *C23C 14/24* (2006.01)
    *H01L 27/32* (2006.01)
    *H01L 51/56* (2006.01)

(52) U.S. Cl.
    CPC ............ *B05B 15/0437* (2013.01); *B05D 1/60* (2013.01); *C23C 14/042* (2013.01); *C23C 14/24* (2013.01); *C23C 14/50* (2013.01); *H01L 21/6776* (2013.01); *H01L 21/67173* (2013.01); *H01L 21/67709* (2013.01); *H01L 21/67784* (2013.01); *H01L 21/6831* (2013.01); *H01L 27/3244* (2013.01); *H01L 27/3246* (2013.01); *H01L 51/56* (2013.01)

(58) Field of Classification Search
    USPC .......................... 414/222.07; 198/619, 803.6
    See application file for complete search history.

(56) References Cited

U.S. PATENT DOCUMENTS

| | | | |
|---|---|---|---|
| 4,624,617 A * | 11/1986 | Belna | B65G 54/02 104/282 |
| 4,693,207 A | 9/1987 | Hayakawa et al. | |
| 4,805,761 A | 2/1989 | Totsch | |
| 4,918,517 A | 4/1990 | Burgoon | |
| 5,348,703 A | 9/1994 | Bishop et al. | |
| 5,360,470 A | 11/1994 | Ono et al. | |
| 5,377,596 A | 1/1995 | Ono et al. | |
| 5,487,609 A | 1/1996 | Asada | |
| 5,601,027 A | 2/1997 | Shinozaki et al. | |
| 5,641,054 A | 6/1997 | Mori et al. | |
| 5,909,995 A | 6/1999 | Wolf et al. | |
| 6,184,596 B1 | 2/2001 | Ohzeki | |
| 6,222,198 B1 | 4/2001 | Brown | |
| 6,271,606 B1 | 8/2001 | Hazelton | |
| 6,274,198 B1 | 8/2001 | Dautartas | |
| 6,371,451 B1 | 4/2002 | Choi | |
| 6,417,034 B2 | 7/2002 | Kitazume et al. | |
| 6,483,690 B1 | 11/2002 | Nakajima et al. | |
| 6,589,673 B1 | 7/2003 | Kido et al. | |
| 6,684,794 B2 | 2/2004 | Fiske et al. | |
| 6,699,324 B1 | 3/2004 | Berdin et al. | |
| 6,749,906 B2 | 6/2004 | Van Slyke | |
| 6,995,035 B2 | 2/2006 | Cok et al. | |
| RE39,024 E | 3/2006 | Takahashi | |
| 7,078,070 B2 | 7/2006 | Peng | |
| 7,199,520 B2 | 4/2007 | Fujii et al. | |
| 7,575,406 B2 | 8/2009 | Hofmeister et al. | |
| 7,622,006 B2 | 11/2009 | Ishizawa et al. | |
| 7,954,434 B2 | 6/2011 | Yeo et al. | |
| 7,964,037 B2 | 6/2011 | Fukuda et al. | |
| 7,988,398 B2 | 8/2011 | Hofmeister et al. | |
| 8,192,546 B2 | 6/2012 | Kim et al. | |
| 8,602,706 B2 * | 12/2013 | Hofmeister | H01L 21/67196 198/619 |
| 8,673,077 B2 | 3/2014 | Sonoda et al. | |
| 8,900,976 B2 | 12/2014 | Jin et al. | |
| 9,246,377 B2 | 1/2016 | Fukasawa et al. | |
| 2001/0006827 A1 | 7/2001 | Yamazaki et al. | |
| 2001/0026748 A1 | 10/2001 | Blonigan et al. | |
| 2001/0034175 A1 | 10/2001 | Miyazaki et al. | |
| 2002/0011785 A1 | 1/2002 | Tang et al. | |
| 2002/0017245 A1 | 2/2002 | Tsubaki et al. | |
| 2002/0033136 A1 | 3/2002 | Savage et al. | |
| 2002/0076847 A1 | 6/2002 | Yamada et al. | |
| 2002/0168577 A1 | 11/2002 | Yoon | |
| 2002/0179013 A1 | 12/2002 | Kido et al. | |
| 2002/0194727 A1 | 12/2002 | Cho et al. | |
| 2003/0045098 A1 | 3/2003 | Verhaverbeke et al. | |
| 2003/0101937 A1 | 6/2003 | Van Slyke et al. | |
| 2003/0151637 A1 | 8/2003 | Nakamura et al. | |
| 2003/0168013 A1 | 9/2003 | Freeman et al. | |
| 2003/0221614 A1 | 12/2003 | Kang et al. | |
| 2003/0221620 A1 | 12/2003 | Yamazaki | |
| 2003/0232563 A1 | 12/2003 | Kamiyama et al. | |
| 2004/0028349 A1 | 2/2004 | Nagasaka et al. | |
| 2004/0056244 A1 | 3/2004 | Marcus et al. | |
| 2004/0062856 A1 | 4/2004 | Marcus et al. | |
| 2004/0115338 A1 | 6/2004 | Yoneda | |
| 2004/0119358 A1 | 6/2004 | Thornton et al. | |
| 2004/0123804 A1 | 7/2004 | Yamazaki et al. | |
| 2004/0127066 A1 | 7/2004 | Jung | |
| 2004/0134428 A1 | 7/2004 | Sasaki et al. | |
| 2004/0142108 A1 | 7/2004 | Atobe et al. | |
| 2004/0144321 A1 | 7/2004 | Grace et al. | |
| 2004/0157167 A1 | 8/2004 | Mori | |
| 2004/0194702 A1 | 10/2004 | Sasaki et al. | |
| 2004/0237895 A1 | 12/2004 | Carpenter et al. | |
| 2004/0238125 A1 * | 12/2004 | Ono | H01J 37/32623 156/345.46 |
| 2004/0255857 A1 | 12/2004 | Chow et al. | |
| 2004/0263547 A1 | 12/2004 | Sugahara | |
| 2004/0263771 A1 | 12/2004 | Jeong et al. | |
| 2005/0016461 A1 | 1/2005 | Klug et al. | |
| 2005/0031836 A1 | 2/2005 | Hirai | |
| 2005/0037136 A1 | 2/2005 | Yamamoto | |
| 2005/0072359 A1 | 4/2005 | Kim | |
| 2005/0166842 A1 | 8/2005 | Sakamoto | |
| 2005/0166844 A1 | 8/2005 | Gralenski | |
| 2005/0183670 A1 | 8/2005 | Grantham et al. | |
| 2005/0244580 A1 | 11/2005 | Cok et al. | |
| 2005/0263074 A1 | 12/2005 | Masuda et al. | |
| 2005/0280356 A1 | 12/2005 | Murayama et al. | |
| 2006/0012280 A1 | 1/2006 | Kang et al. | |
| 2006/0012771 A1 | 1/2006 | Jeong | |
| 2006/0040132 A1 | 2/2006 | Liao et al. | |
| 2006/0102078 A1 | 5/2006 | Fairbairn et al. | |
| 2006/0103289 A1 | 5/2006 | Kim et al. | |
| 2006/0130766 A1 | 6/2006 | Kim et al. | |
| 2006/0144325 A1 | 7/2006 | Jung et al. | |
| 2006/0150910 A1 | 7/2006 | Han et al. | |
| 2006/0164786 A1 | 7/2006 | Kobayashi et al. | |
| 2006/0169211 A1 | 8/2006 | Kim et al. | |
| 2006/0174829 A1 | 8/2006 | An et al. | |
| 2006/0194435 A1 | 8/2006 | Nishimura et al. | |
| 2006/0205101 A1 | 9/2006 | Lee et al. | |
| 2006/0240669 A1 | 10/2006 | Kaneko et al. | |
| 2006/0255722 A1 | 11/2006 | Imanishi | |
| 2006/0269671 A1 | 11/2006 | Kim et al. | |
| 2006/0278522 A1 | 12/2006 | Kim et al. | |
| 2006/0278945 A1 | 12/2006 | Sakurai | |
| 2007/0009552 A1 | 1/2007 | Whitehead et al. | |
| 2007/0009652 A1 | 1/2007 | Manz et al. | |
| 2007/0015430 A1 | 1/2007 | Nishio et al. | |
| 2007/0017445 A1 | 1/2007 | Takehara et al. | |
| 2007/0046913 A1 | 3/2007 | Shibazaki | |
| 2007/0054051 A1 | 3/2007 | Arai et al. | |
| 2007/0077358 A1 | 4/2007 | Jeong et al. | |
| 2007/0137568 A1 | 6/2007 | Schreiber | |
| 2007/0178708 A1 | 8/2007 | Ukigaya | |
| 2007/0235157 A1 | 10/2007 | Bunker et al. | |
| 2007/0275497 A1 | 11/2007 | Kwack et al. | |

(56) References Cited

U.S. PATENT DOCUMENTS

| | | |
|---|---|---|
| 2007/0297887 A1 | 12/2007 | Tanaka |
| 2008/0018236 A1 | 1/2008 | Arai et al. |
| 2008/0029368 A1 | 2/2008 | Komori |
| 2008/0057183 A1 | 3/2008 | Spindler et al. |
| 2008/0115729 A1 | 5/2008 | Oda et al. |
| 2008/0118743 A1 | 5/2008 | Lee et al. |
| 2008/0131587 A1 | 6/2008 | Boroson et al. |
| 2008/0145534 A1 | 6/2008 | Lee et al. |
| 2008/0168945 A1* | 7/2008 | Kim .................. H01J 37/32082 |
| 2008/0216741 A1 | 9/2008 | Ling et al. |
| 2008/0257716 A1 | 10/2008 | Nagata et al. |
| 2008/0286461 A1 | 11/2008 | Noguchi et al. |
| 2008/0290791 A1 | 11/2008 | Lee et al. |
| 2008/0298947 A1 | 12/2008 | Yeo et al. |
| 2008/0305246 A1 | 12/2008 | Choi et al. |
| 2009/0002659 A1 | 1/2009 | Hiyama |
| 2009/0017192 A1 | 1/2009 | Matsuura |
| 2009/0153033 A1 | 6/2009 | Lee et al. |
| 2009/0169868 A1 | 7/2009 | Haglund et al. |
| 2009/0218219 A1 | 9/2009 | Yamazaki |
| 2009/0229524 A1 | 9/2009 | Kim et al. |
| 2009/0232976 A1 | 9/2009 | Yoon et al. |
| 2009/0258142 A1* | 10/2009 | An ...................... C23C 14/042 427/255.6 |
| 2009/0279173 A1 | 11/2009 | Chui et al. |
| 2009/0304924 A1 | 12/2009 | Gadgil |
| 2009/0308317 A1 | 12/2009 | Sone et al. |
| 2009/0315456 A1 | 12/2009 | Furukawa et al. |
| 2010/0043712 A1 | 2/2010 | Tobe et al. |
| 2010/0130020 A1 | 5/2010 | Kim et al. |
| 2010/0156279 A1 | 6/2010 | Tamura et al. |
| 2010/0237777 A1* | 9/2010 | Kim .................. H01J 37/32082 313/607 |
| 2010/0239746 A1 | 9/2010 | Yamazaki et al. |
| 2010/0273387 A1* | 10/2010 | Inoue ................ C23C 14/042 445/58 |
| 2010/0316791 A1 | 12/2010 | Lin |
| 2010/0316801 A1 | 12/2010 | Lee et al. |
| 2011/0005683 A1* | 1/2011 | Kim ...................... H01J 37/321 156/345.35 |
| 2011/0042659 A1 | 2/2011 | Kim et al. |
| 2011/0052791 A1 | 3/2011 | Jo et al. |
| 2011/0052795 A1 | 3/2011 | Choi et al. |
| 2011/0053301 A1 | 3/2011 | Kang et al. |
| 2011/0117288 A1* | 5/2011 | Honda .................. C23C 16/045 427/533 |
| 2011/0241438 A1 | 10/2011 | Kim et al. |
| 2011/0244120 A1 | 10/2011 | Choi et al. |
| 2012/0006259 A1 | 1/2012 | Sung et al. |
| 2012/0214263 A1 | 8/2012 | Yamazaki et al. |
| 2012/0295379 A1 | 11/2012 | Sonoda et al. |
| 2012/0326157 A1 | 12/2012 | Park et al. |
| 2013/0009177 A1 | 1/2013 | Chang et al. |
| 2013/0217158 A1 | 8/2013 | Lee |
| 2013/0267055 A1 | 10/2013 | Ro et al. |
| 2013/0341598 A1 | 12/2013 | Chang et al. |
| 2014/0034917 A1 | 2/2014 | Lee et al. |
| 2014/0045343 A1 | 2/2014 | Choi et al. |
| 2014/0077168 A1 | 3/2014 | Kim |
| 2014/0084262 A1 | 3/2014 | Kim |
| 2014/0084263 A1 | 3/2014 | Jin et al. |
| 2014/0110680 A1 | 4/2014 | Choe |
| 2014/0131667 A1 | 5/2014 | Chang |
| 2015/0122180 A1 | 5/2015 | Chang et al. |

FOREIGN PATENT DOCUMENTS

| | | |
|---|---|---|
| CN | 1607868 A | 4/2005 |
| CN | 1682569 A | 10/2005 |
| CN | 1704501 A | 12/2005 |
| CN | 1716102 A | 1/2006 |
| CN | 1814854 A | 8/2006 |
| CN | 1841696 A | 10/2006 |
| CN | 202786403 U | 3/2013 |
| CN | 102005541 A | 8/2013 |
| EP | 1 413 644 A2 | 4/2004 |
| EP | 1 418 250 A2 | 5/2004 |
| EP | 1 518 940 A1 | 3/2005 |
| JP | 53-113782 | 10/1978 |
| JP | 2-247372 | 10/1990 |
| JP | 04-272170 | 9/1992 |
| JP | 5-22405 U1 | 3/1993 |
| JP | 9 17846 | 1/1997 |
| JP | 09-095776 | 4/1997 |
| JP | 10-050478 | 2/1998 |
| JP | 10-120171 | 5/1998 |
| JP | 2000-068054 | 3/2000 |
| JP | 2001-28325 A2 | 1/2001 |
| JP | 2001-052862 | 2/2001 |
| JP | 2001-093667 | 4/2001 |
| JP | 2002-175878 | 6/2002 |
| JP | 2002-348659 | 12/2002 |
| JP | 2003-003250 | 1/2003 |
| JP | 2003-077662 | 3/2003 |
| JP | 2003-157973 | 5/2003 |
| JP | 2003-297562 | 10/2003 |
| JP | 2003-347394 | 12/2003 |
| JP | 2004-043898 | 2/2004 |
| JP | 2004-076150 | 3/2004 |
| JP | 2004-103269 | 4/2004 |
| JP | 2004-103341 | 4/2004 |
| JP | 2004-137583 | 5/2004 |
| JP | 2004-143521 | 5/2004 |
| JP | 2004-199919 | 7/2004 |
| JP | 2004-342455 | 12/2004 |
| JP | 2004-349101 | 12/2004 |
| JP | 2005-044592 | 2/2005 |
| JP | 2005-213616 | 8/2005 |
| JP | 2005-235568 | 9/2005 |
| JP | 2005-293968 | 10/2005 |
| JP | 2005-296737 | 10/2005 |
| JP | 2006-275433 | 10/2006 |
| JP | 2006-307247 | 11/2006 |
| JP | 2007-047293 | 2/2007 |
| JP | 2007-146219 | 6/2007 |
| JP | 2008-019477 | 1/2008 |
| JP | 2008-121098 | 5/2008 |
| JP | 2009-019243 | 1/2009 |
| JP | 2009-087910 | 4/2009 |
| JP | 2009-117231 | 5/2009 |
| JP | 2009-520110 | 5/2009 |
| JP | 2010-140840 A | 6/2010 |
| JP | 2010-159167 | 7/2010 |
| KR | 1997-0008709 | 2/1997 |
| KR | 10-0257219 B1 | 2/2000 |
| KR | 10-2000-0019254 | 4/2000 |
| KR | 10-2000-0023929 | 5/2000 |
| KR | 10-2001-0059939 | 7/2001 |
| KR | 10-2002-0000201 | 1/2002 |
| KR | 10-2002-0050922 | 6/2002 |
| KR | 2002-0088662 A | 11/2002 |
| KR | 10-2002-0090934 | 12/2002 |
| KR | 10-2003-0043012 | 6/2003 |
| KR | 10-0397635 B1 | 9/2003 |
| KR | 10-0405080 | 11/2003 |
| KR | 10-0406059 | 11/2003 |
| KR | 10-2003-0091947 | 12/2003 |
| KR | 10-2003-0093959 | 12/2003 |
| KR | 10-2004-0034537 | 4/2004 |
| KR | 10-0430336 | 5/2004 |
| KR | 10-2004-0050045 | 6/2004 |
| KR | 10-2004-0069281 | 8/2004 |
| KR | 10-2004-0084747 | 10/2004 |
| KR | 10-0463212 | 12/2004 |
| KR | 10-2005-0024324 | 3/2005 |
| KR | 10-0483487 B1 | 4/2005 |
| KR | 10-0520159 | 10/2005 |
| KR | 10-2006-0001033 | 1/2006 |
| KR | 10-2006-0008602 | 1/2006 |
| KR | 10-2006-0018745 | 3/2006 |
| KR | 10-2006-0060994 | 6/2006 |
| KR | 10-2006-0073367 | 6/2006 |
| KR | 10-2006-0077887 A | 7/2006 |

(56) References Cited

FOREIGN PATENT DOCUMENTS

| | | |
|---|---|---|
| KR | 10-2006-0080475 | 7/2006 |
| KR | 10-2006-0080481 | 7/2006 |
| KR | 10-2006-0080482 | 7/2006 |
| KR | 10-2006-0083510 | 7/2006 |
| KR | 10-2006-0104675 | 10/2006 |
| KR | 10-2006-0104677 | 10/2006 |
| KR | 10-2006-0109627 | 10/2006 |
| KR | 10-0635903 B1 | 10/2006 |
| KR | 10-0646160 | 11/2006 |
| KR | 10-0687007 | 2/2007 |
| KR | 10-0696547 B1 | 3/2007 |
| KR | 10-0697663 B1 | 3/2007 |
| KR | 10-0698033 | 3/2007 |
| KR | 10-0700466 | 3/2007 |
| KR | 10-2007-0035796 | 4/2007 |
| KR | 10-0711885 | 4/2007 |
| KR | 10-2007-0050793 | 5/2007 |
| KR | 10-0723627 B1 | 5/2007 |
| KR | 10-2007-0056190 | 6/2007 |
| KR | 10-0726132 | 6/2007 |
| KR | 10-0736218 B1 | 7/2007 |
| KR | 10-0741142 B1 | 7/2007 |
| KR | 10-2007-0078713 | 8/2007 |
| KR | 10-2007-0080635 | 8/2007 |
| KR | 10-2007-0091437 | 9/2007 |
| KR | 10-2007-0101842 | 10/2007 |
| KR | 10-2007-0105595 | 10/2007 |
| KR | 10-0770653 B1 | 10/2007 |
| KR | 10-2008-0001184 | 1/2008 |
| KR | 10-2008-0007896 | 1/2008 |
| KR | 10-2008-0009285 | 1/2008 |
| KR | 10-0797787 B1 | 1/2008 |
| KR | 10-0800125 B1 | 1/2008 |
| KR | 10-0815265 B1 | 3/2008 |
| KR | 10-0823508 B1 | 4/2008 |
| KR | 10-2008-0044239 | 5/2008 |
| KR | 10-2008-0046761 | 5/2008 |
| KR | 10-0827760 B1 | 5/2008 |
| KR | 10-2008-0057159 | 6/2008 |
| KR | 10-0839380 B1 | 6/2008 |
| KR | 10-2008-0060400 | 7/2008 |
| KR | 10-2008-0061132 | 7/2008 |
| KR | 10-2008-0062212 | 7/2008 |
| KR | 10-2008-0076574 | 8/2008 |
| KR | 10-2008-0104479 | 12/2008 |
| KR | 10-2008-0104695 | 12/2008 |
| KR | 10-2009-0038733 | 4/2009 |
| KR | 10-0899279 B1 | 5/2009 |
| KR | 10-2009-0066996 | 6/2009 |
| KR | 10-2009-0075887 A | 7/2009 |
| KR | 10-2009-0079765 A | 7/2009 |
| KR | 10-2009-0081717 | 7/2009 |
| KR | 10-2009-0094911 | 9/2009 |
| KR | 10-2009-0097453 | 9/2009 |
| KR | 10-2009-0098186 | 9/2009 |
| KR | 10-2010-0002381 | 1/2010 |
| KR | 10-2010-0038088 | 4/2010 |
| KR | 10-2010-0044606 A | 4/2010 |
| KR | 10-2010-0128589 A | 12/2010 |
| KR | 10-101-7654 B1 | 2/2011 |
| KR | 10-2011-0058344 | 6/2011 |
| KR | 10-2011-0110525 A | 10/2011 |
| KR | 10-2012-0060498 | 6/2012 |
| WO | WO 03/043067 A1 | 5/2003 |
| WO | WO 2004/016406 | 2/2004 |

OTHER PUBLICATIONS

U.S. Notice of Allowance dated Feb. 29, 2016, for U.S. Appl. No. 13/492,144 (10 sheets).
U.S. Office Action dated Apr. 21, 2016, for U.S. Appl. No. 14/012,924 (11 sheets).
U.S. Notice of Allowance dated Aug. 9, 2016, for U.S. Appl. No. 13/492,144 (9 sheets).
U.S. Notice of Allowance dated Aug. 24, 2016, for U.S. Appl. No. 14/012,924 (10 sheets).
English machine translation of Claims 1-3 of Japanese Publication 53-113782 dated Oct. 4, 1978, (1 page).
EP Extended Search Report issued on Oct. 11, 2012 for Corresponding EP Application No. 12174739.8 (5 pages).
EPO Office action dated Dec. 17, 2015, for corresponding European Patent application 12174739.8, (6 pages).
EPO Search Report dated May 13, 2011 for European Patent application 11250019.4, (6 pages).
EPO Search Report dated May 20, 2011 for European Patent application 10251404.9, (12 pages).
EPO Search Report dated Sep. 6, 2010 for European Patent application 10250962.7, (5 pages).
European Search Report dated May 27, 2011, for European Patent Application No. 10251514.5 (11 sheets).
Full English Translation of JP 2001-052862, 20 pages.
Full English Translation of JP 2003-003250, 25 pages.
JPO Office action dated Apr. 5, 2016, corresponding to Japanese Patent application 2012-149279, (3 pages).
JPO Office action dated Jan. 20, 2015 for Japanese Patent application 2011-118696, (5 pages).
JPO Office action dated Jan. 22, 2013 for Japanese Patent application 2010-116470, (3 pages).
JPO Office action dated Jan. 8, 2013 for Japanese Patent application 2011-000180, (3 pages).
JPO Office action dated Mar. 19, 2013 for Japanese Patent application 2011-097909, (3 pages).
KIPO Notice of Allowance dated Apr. 26, 2012, for Korean Patent application 10-2010-0066991, (5 pages).
KIPO Office action dated Apr. 9, 2012, for Korean Patent application 10-2010-0031556, (4 pages).
KIPO Office action dated Jul. 1, 2011 for Korean Patent application 10-2009-0072111, (4 pages).
KIPO Office action dated Jun. 1, 2011 for Korean Patent application 10-2009-0050528, (4 pages).
KIPO Registration Determination Certificate dated Jul. 2, 2012, for Korean Patent application 10-2010-0011480, (5 pages).
KIPO Registration Determination Certificate dated Jul. 2, 2012, for Korean priority Patent application 10-2010-0011481, (5 pages).
KIPO Registration Determination Certificate dated Oct. 27, 2011 for Korean Patent application 10-2010-0002381, (5 pages).
KIPO Registration Determination Certificate dated Sep. 23, 2011 for Korean Patent application 10-2009-0055473, (5 pages).
KIPO Registration Determination Certificate dated Sep. 28, 2011 for Korean Patent application 10-2009-0052359, (5 pages).
KIPO Registration Determination Certificate dated Sep. 28, 2011 for Korean Patent application 10-2009-0045200, (5 pages).
KIPO Registration Determination Certificate dated Sep. 28, 2011 for Korean Patent application 10-2009-0045201, (5 pages).
Korean Office action dated Feb. 6, 2012, corresponding to KR 10-2010-0011481, 7 pages.
Korean Office action dated Feb. 6, 2012, corresponding to KR 10-2010-0011480, 8 pages.
Korean Patent Abstracts for Korean Publication 10-2003-0013721, dated Feb. 15, 2003, corresponding to Korean Patent 10-0397635 dated Sep. 16, 2003.
Korean Patent Abstracts for Korean Publication 10-2007-0050793, dated May 16, 2007, corresponding to Korean Patent 10-0815265 dated Mar. 19, 2008.
Korean Patent Abstracts, Publication No. 10-0151312 B1, dated Jun. 18, 1998, corresponding to Korean Publication 1997-0008709.
Korean Patent Abstracts, Publication No. 10-0151312 B1, dated Jun. 6, 1998, corresponding to Korean Patent 1997-0008709.
Korean Patent Abstracts, Publication No. 1020010062735, dated Jul. 7, 2001, corresponding to Korean Patent 10-0827760.
Korean Patent Abstracts, Publication No. 1020020056238, dated Jul. 10, 2002, corresponding to Korean Patent 10-0698033.
Korean Patent Abstracts, Publication No. 1020020086047, dated Nov. 18, 2002, for corresponding Korean Patent 10-0405080.
Korean Patent Abstracts, Publication No. 1020020088662, dated Nov. 29, 2002, for corresponding Korean Patent 10-0463212.

(56) References Cited

OTHER PUBLICATIONS

Korean Patent Abstracts, Publication No. 1020040062203, dated Jul. 7, 2002, for corresponding Korean Patent 10-0646160.
Korean Patent Abstracts, Publication No. 1020050045619, dated May 17, 2005, for corresponding Korean Patent 10-0520159.
Korean Patent Abstracts, Publication No. 1020050078637, dated Aug. 5, 2005, corresponding to Korean Patent 10-0700466.
Korean Patent Abstracts, Publication No. 1020060101987, dated Sep. 27, 2006, corresponding to Korean Patent 10-0687007.
Korean Patent Abstracts, Publication No. 10-20060126267, dated Dec. 7, 2006, corresponding to Korean Patent 10-0797787 B1.
Korean Patent Abstracts, Publication No. 1020070025164, dated Mar. 8, 2007, corresponding to Korean Patent 10-0711885.
Korean Patent Abstracts, Publication No. 10-2007-0056241, dated Jun. 4, 2007, corresponding to Korean Patent 10-0741142 B1.
Korean Patent Abstracts, Publication No. 10-2008-0002189, dated Jan. 4, 2008, corresponding to Korean Patent 10-0800125 B1.
Korean Patent Abstracts, Publication No. 1020080038650, dated May 7, 2008, corresponding to Korean Patent 10-0839380.
Korean Patent Abstracts, Publication No. 10-2008-0070302, dated Jul. 30, 2008, corresponding to Korean Patent 10-0899279 B1.
Patent Abstracts of Japan, and English machine translation of Japanese Publication 2004-349101 dated Dec. 9, 2004, (11 pages).
SIPO Certificate of Patent dated Aug. 14, 2013, for Chinese application 20100266406.6, (36 pages).
SIPO Certificate of Patent dated Jul. 31, 2013, for Chinese Patent application 201110029291.3 (31 pages).
SIPO Office action dated Feb. 2, 2015, for Chinese Patent application 201110199594.X, (12 pages).
SIPO Office action dated Nov. 28, 2012, for Chinese Patent application 201110029291.3, (11 pages).
SIPO Office Action dated Oct. 9, 2012 for Chinese Application No. 201010266406.6.
SIPO Office action dated Oct. 9, 2012, for Chinese Patent application 201010266406.6, (6 pages).
U.S. Notice of Allowance dated Apr. 17, 2014 for U.S. Appl. No. 13/797,836, (10 pages).
U.S. Notice of Allowance dated Jun. 17, 2014 for U.S. Appl. No. 13/157,220, (36 pages).
U.S. Notice of Allowance dated Jun. 30, 2014 for U.S. Appl. No. 12/907,396, (40 pages).
U.S. Notice of Allowance dated Oct. 28, 2014 for U.S. Appl. No. 13/014,225, (64 pages).
U.S. Office action dated Apr. 21, 2016, for cross reference U.S. Appl. No. 14/012,924, (11 pages).
U.S. Office Action dated Aug. 2, 2013 for U.S. Appl. No. 12/868,099.
U.S. Office action dated Aug. 8, 2013 for U.S. Appl. No. 13/093,707 (7 pages).
U.S. Office action dated Dec. 13, 2011 for U.S. Appl. No. 12/849,193, (30 pages).
U.S. Office action dated Dec. 31, 2014 for U.S. Appl. No. 12/873,556, (72 pages).
U.S. Office action dated Dec. 31, 2014 for U.S. Appl. No. 13/469,029 (74 pages).
U.S. Office action dated Jul. 24, 2013 for U.S. Appl. No. 12/784,804 (52 pages).
U.S. Office action dated Jun. 11, 2013 for U.S. Appl. No. 12/979,656, (50 pages).
U.S. Office action dated Jun. 17, 2013, for cross reference U.S. Appl. No. 13/180,454, (23 pages).
U.S. Office action dated Jun. 19, 2015 for U.S. Appl. No. 14/012,924, (30 pages).
U.S. Office Action dated Jun. 21, 2011 for U.S. Appl. No. 12/862,153 (21 pages).
U.S. Office action dated Jun. 21, 2011 for U.S. Appl. No. 12/862,153, (21 pages).
U.S. Office action dated Mar. 16, 2015 for U.S. Appl. No. 13/654,378, (12 pages).
U.S. Office action dated Mar. 23, 2012 for U.S. Appl. No. 12/849,193, (17 pages).
U.S. Office action dated May 22, 2013, for cross reference U.S. Appl. No. 13/219,427, (26 pages).
U.S. Office action dated Nov. 14, 2014 for U.S. Appl. No. 13/178,472, (10 pages).
U.S. Office action dated Nov. 20, 2013, for cross reference U.S. Appl. No. 12/868,099, (14 pages).
U.S. Office action dated Nov. 25, 2013 for U.S. Appl. No. 13/176,701 (49 pages).
U.S. Office action dated Nov. 4, 2013, for U.S. Appl. No. 13/219,427, (26 pages).
U.S. Office action dated Oct. 3, 2012, for cross reference U.S. Appl. No. 12/869,830, (28 pages).
U.S. Office action dated Sep. 25, 2013, for U.S. Appl. No. 13/031,756, (34 pages).
U.S. Office action dated Sep. 26, 2014 for U.S. Appl. No. 12/868,099, (66 pages).
U.S. Office action dated Dec. 3, 2015 for U.S. Appl. No. 13/492,144 (33 pages).
U.S. Office Action dated Dec. 2, 2016, issued in cross-reference U.S. Appl. No. 13/943,221 (38 pages).
SIPO Granted Document dated Mar. 1, 2017, for corresponding Chinese Patent Application No. 201210228413.6 (28 pages).

* cited by examiner

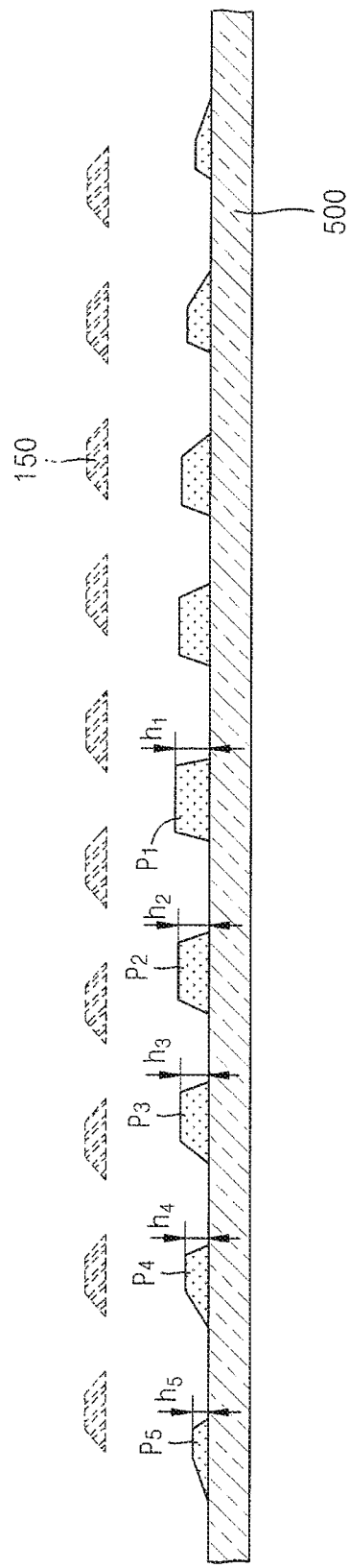

ORGANIC LAYER DEPOSITION APPARATUS AND METHOD OF MANUFACTURING ORGANIC LIGHT-EMITTING DISPLAY DEVICE BY USING THE SAME

CROSS-REFERENCE TO RELATED PATENT APPLICATION

This application is a divisional of U.S. application Ser. No. 13/492,144, filed on Jun. 8, 2012, which claims priority to and the benefit of Korean Patent Application No. 10-2011-0066124, filed on Jul. 4, 2011, in the Korean Intellectual Property Office, the disclosures of both of which are incorporated herein in their entirety by reference.

BACKGROUND

1. Field

Aspects of embodiments according to the present invention relate to an organic layer deposition apparatus and a method of manufacturing an organic light-emitting display device by using the same.

2. Description of Related Art

Organic light-emitting display devices have a larger viewing angle, better contrast characteristics, and faster response speeds than other display devices, and thus have drawn attention as next-generation display devices.

Organic light-emitting display devices generally have a stacked structure including an anode, a cathode, and an emission layer interposed between the anode and the cathode. The devices display images in color when holes and electrons, injected respectively from the anode and the cathode, recombine in the emission layer to emit light. However, it is difficult to achieve a high light-emission efficiency with such a structure, and thus intermediate layers, including an electron injection layer, an electron transport layer, a hole transport layer, a hole injection layer, and the like may be additionally interposed between the emission layer and each of the electrodes.

SUMMARY

Aspects of embodiments according to the present invention are directed toward an organic layer deposition apparatus that may be easily manufactured, that may be applied to the manufacture of large-size display devices on a mass scale in a simple fashion, and that improves manufacturing yield and deposition efficiency, and a method of manufacturing an organic light-emitting display device by using the organic layer deposition apparatus.

According to an embodiment of the present invention, there is provided an organic layer deposition apparatus including: an electrostatic chuck for supporting a substrate; a deposition unit including a chamber for maintaining a vacuum and an organic layer deposition assembly for depositing at least one organic layer on the substrate supported by the electrostatic chuck; and a first conveyor unit passing through the chamber and for moving the electrostatic chuck supporting the substrate into the deposition unit, wherein the first conveyor unit includes a guide unit including a receiving member for supporting the electrostatic chuck to be movable in a direction while the electrostatic chuck is spaced apart from the first conveyor unit, and wherein the substrate is spaced apart from the organic layer deposition assembly, and the substrate or the organic layer deposition assembly is configured to be moved relative to the other during deposition.

In one embodiment, the organic layer deposition apparatus further includes: a loading unit for fixing the substrate to the electrostatic chuck; and an unloading unit for separating the substrate on which deposition has been completed from the electrostatic chuck. The first conveyor unit may be configured to sequentially move the electrostatic chuck to the loading unit, the deposition unit, and the unloading unit. The organic layer deposition apparatus may further include a second conveyor unit for returning the electrostatic chuck separated from the substrate, from the unloading unit to the loading unit.

In one embodiment, the guide unit includes: a driving unit for generating a driving force to move the electrostatic chuck; and a magnetic levitation bearing for levitating the electrostatic chuck above the receiving member to move without contacting the receiving member. The driving unit may include a linear motor. The linear motor may include a magnetic rail disposed at a side of the electrostatic chuck and a coil disposed in the receiving member. The magnetic levitation bearing may include a side magnetic levitation bearing disposed at a side of the electrostatic chuck, and an upper magnetic levitation bearing disposed on the electrostatic chuck, and the driving unit may be disposed at a side of the electrostatic chuck. The magnetic levitation bearing may include a magnet selected from the group consisting of electromagnets, permanent magnets, superconducting magnets, and combinations thereof.

In one embodiment, the organic layer deposition apparatus further includes a gap sensor for measuring a gap interval between the receiving member and the electrostatic chuck. The organic layer deposition apparatus may further include a magnetic levitation bearing controlled by the gap sensor to provide a magnetic force for levitating the electrostatic chuck above the receiving member. The magnetic levitation bearing may include a side magnetic levitation bearing disposed at a side of the electrostatic chuck, and an upper magnetic levitation bearing disposed on the electrostatic chuck. The gap sensor may include a first gap sensor for measuring a gap interval between the electrostatic chuck and the first conveyor unit along a first direction, and a second gap sensor for measuring a gap interval between the electrostatic chuck and the first conveyor unit along a second direction crossing the first direction.

In one embodiment, the organic layer deposition apparatus further includes: a first magnetic levitation bearing for levitating the electrostatic chuck to be spaced apart from the first conveyor unit along a first direction; and a second magnetic levitation bearing for levitating the electrostatic chuck to be spaced apart from the first conveyor unit along a second direction crossing the first direction.

In one embodiment, the receiving member includes a receiving groove for receiving the opposite sides of the electrostatic chucks.

In one embodiment, the organic layer deposition assembly includes a plurality of organic layer deposition assemblies disposed in the chamber.

In one embodiment, the chamber includes a first chamber and a second chamber interconnected with each other, and the organic layer deposition assembly includes a plurality of organic layer deposition assemblies disposed in each of the first and second chamber.

In one embodiment, the organic layer deposition assembly includes: a deposition source configured to discharge a deposition material; a deposition source nozzle unit disposed at a side of the deposition source and including a plurality of deposition source nozzles; and a patterning slit sheet disposed to face and spaced apart from the deposition source nozzle unit, having a plurality of patterning slits, and being smaller than the substrate.

According to another embodiment of the present invention, there is provided an active matrix organic light-emitting display device including: the above substrate having a size of at least 40 inches; and the at least one organic layer on the substrate having a linear pattern formed using the above organic layer deposition apparatus.

In one embodiment, the at least one organic layer includes an emission layer (EML). The at least one organic layer may further include a layer selected from the group consisting of a hole injection layer (HIL), a hole transport layer (HTL), an electron transport layer (ETL), an electron injection layer (EIL), and combinations thereof.

In one embodiment, the at least one organic layer has a non-uniform thickness.

According to another embodiment of the present invention, there is provided an active matrix organic light-emitting display device including: the at least one organic layer having a non-uniform thickness formed using the above organic layer deposition apparatus.

According to another embodiment of the present invention, there is provided a method of manufacturing an organic light-emitting display device, the method including: supporting a substrate with an electrostatic chuck; conveying the electrostatic chuck supporting the substrate into a chamber maintained at a vacuum by using a first conveyor unit passing through the chamber; and depositing at least one organic layer on the substrate by using an organic layer deposition assembly disposed in the chamber while the substrate or the organic layer deposition assembly moves relative to the other, wherein the electrostatic chuck is moved with the first conveyor unit in the chamber while spaced apart from the first conveyor unit, and wherein the substrate is spaced apart from the organic layer deposition assembly.

In one embodiment, the conveying of the electrostatic chuck includes levitating the electrostatic chuck to be spaced apart from the first conveyor unit. The conveying of the electrostatic chuck may include: generating a driving force by a driving unit to move the electrostatic chuck; and levitating the electrostatic chuck to move without contacting the first conveyor unit by a magnetic levitation bearing.

In one embodiment, the conveying of the electrostatic chuck includes measuring a gap interval between the first conveyor unit and the electrostatic chuck by a gap sensor (621, 622). The conveying of the electrostatic chuck may include: controlling a magnetic levitation bearing by the gap sensor to provide a magnetic force; and levitating the electrostatic chuck to move without contacting the first conveyor unit by the magnetic force. The magnetic levitation bearing may include a side magnetic levitation bearing disposed at a side of the electrostatic chuck, and an upper magnetic levitation bearing disposed on the electrostatic chuck. The measuring of the gap interval may include: measuring a gap interval between the electrostatic chuck and the first conveyor unit along a first direction by a first gap sensor; and measuring a gap interval between the electrostatic chuck and the first conveyor unit along a second direction crossing the first direction by a second gap sensor. The levitating of the electrostatic chuck to move without contacting the first conveyor unit by the magnetic force may include: levitating the electrostatic chuck to be spaced apart from the first conveyor unit along a first direction by a first magnetic levitation bearing; and levitating the electrostatic chuck to be spaced apart from the first conveyor unit along a second direction crossing the first direction by a second magnetic levitation bearing.

In one embodiment, the method further includes, after the depositing of the organic layer: removing the substrate on which the deposition has been completed out of the chamber by using the first conveyor unit; separating the substrate from the electrostatic chuck; and returning the electrostatic chuck separated from the substrate to support another substrate with the electrostatic chuck by using a second conveyor unit disposed outside the chamber.

In one embodiment, the deposition assembly includes a plurality of organic layer deposition assemblies disposed in the chamber, and the depositing is performed by using the plurality of organic layer deposition assemblies in sequence.

In one embodiment, the chamber includes a first chamber and a second chamber interconnected with each other, and the organic layer deposition assembly includes a plurality of organic layer deposition assemblies disposed in each of the first and second chambers, wherein the depositing is continuously performed with the substrate moving between the first chamber and the second chamber.

In one embodiment, the organic layer deposition assembly includes: a deposition source configured to discharge a deposition material; a deposition source nozzle unit disposed at a side of the deposition source and including a plurality of deposition source nozzles; and a patterning slit sheet disposed to face and spaced apart from the deposition source nozzle unit, having a plurality of patterning slits, and being smaller than the substrate.

In one embodiment, the first conveyor unit includes: a guide unit including a receiving member for supporting the electrostatic chuck to be movable in a direction; a linear motor for generating a driving force to move the electrostatic chuck; and a magnetic levitation bearing for levitating the electrostatic chuck to be spaced apart from the receiving member. The linear motor may include a magnetic rail disposed at a side of the electrostatic chuck and a coil disposed in the receiving member. The magnetic levitation bearing may include a side magnetic levitation bearing disposed at a side of the electrostatic chuck, and an upper magnetic levitation bearing disposed on the electrostatic chuck, and the driving unit is disposed at a side of the electrostatic chuck.

According to another embodiment of the present invention, there is provided an active matrix organic light-emitting display device including: the substrate having a size of at least 40 inches; and the at least one organic layer on the substrate having a linear pattern formed using the above method.

According to another embodiment of the present invention, there is provided an active matrix organic light-emitting display device including: the at least one organic layer having a non-uniform thickness formed using the above method.

BRIEF DESCRIPTION OF THE DRAWING

The above and other features and aspects of the present invention will become more apparent by describing in detail exemplary embodiments thereof with reference to the attached drawing in which:

FIG. 14 is a cross-sectional view of the one or more layers on the substrate taken along line I-I of FIG. 13, according to an embodiment of the present invention.

DETAILED DESCRIPTION

Reference will now be made in detail to embodiments of the present invention, examples of which are illustrated in the accompanying drawings. The invention may, however, be embodied in many different forms and should not be construed as being limited to the embodiments set forth herein; rather, these embodiments are provided so that this disclosure will be thorough and complete, and will fully convey the concept of the invention to those skilled in the art.

Figure 1:
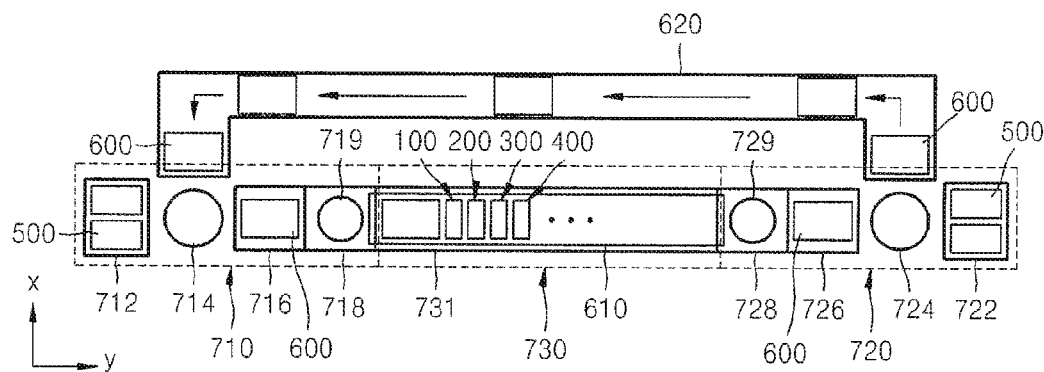
FIG. 1 is a schematic structure diagram of an organic layer deposition apparatus according to an embodiment of the present invention.
Figure 2:
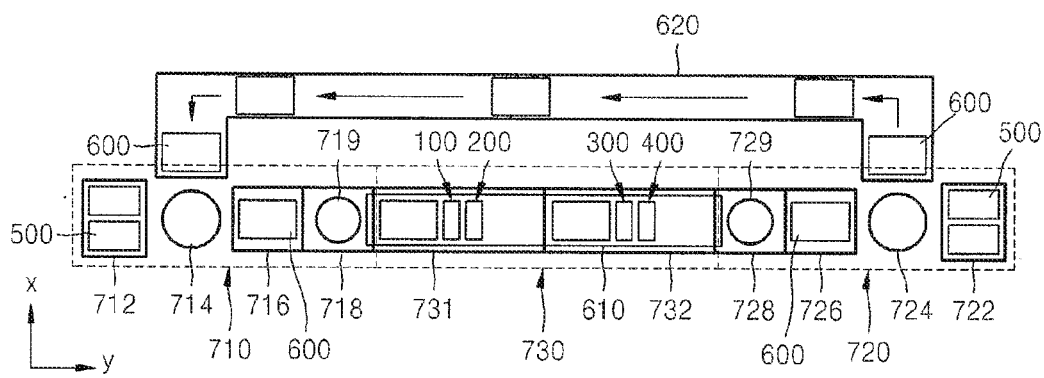
FIG. 2 is a structure diagram of a modified example of the organic layer deposition apparatus of FIG. 1.
Figure 3:
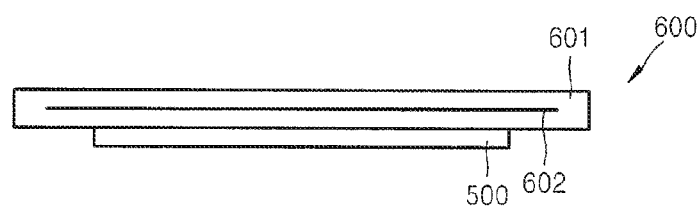
FIG. 3 is a view of an example of an electrostatic chuck.

FIG. 1 is a schematic structure view of an organic layer deposition apparatus according to an embodiment of the present invention. FIG. 2 illustrates a modified example of the organic layer deposition apparatus of FIG. 1. FIG. 3 is a view of an example of an electrostatic chuck 600.

Referring to FIG. 1, the organic layer deposition apparatus according to the current embodiment includes a loading unit 710, a deposition unit 730, an unloading unit 720, a first conveyor unit 610, and a second conveyor unit 620.

The loading unit 710 may include a first rack 712, a transport robot 714, a transport chamber 716, and a first inversion chamber 718.

A plurality of substrates 500 onto which a deposition material is not applied are stacked up on the first rack 712. The transport robot 714 picks up one of the substrates 500 from the first rack 712, disposes it on the electrostatic chuck 600 transferred by the second conveyor unit 620, and moves the electrostatic chuck 600 on which the substrate 500 is disposed into the transport chamber 716.

The first inversion chamber 718 is disposed adjacent to the transport chamber 716. The first inversion chamber 718 includes a first inversion robot 719 that inverts the electrostatic chuck 600 and then loads it onto the first conveyor unit 610 of the deposition unit 730.

Referring to FIG. 3, the electrostatic chuck 600 may include an electrode 602 embedded in a main body 601 of the electrostatic chuck 600. Here, the main body 601 is formed of ceramic, and the electrode 602 is supplied with power. The electrostatic chuck 600 may fix the substrate 500 on a surface of the main body 601 as a high voltage is applied to the electrode 602.

Referring back to FIG. 1, the transport robot 714 places one of the substrates 500 on the surface of the electrostatic chuck 600, and the electrostatic chuck 600 on which the substrate 500 is disposed is loaded into the transport chamber 716. The first inversion robot 719 inverts the electrostatic chuck 600 so that the substrate 500 is turned upside down in the deposition unit 730.

The unloading unit 720 is constituted to operate in an opposite manner to the loading unit 710 described above. Specifically, a second inversion robot 729 in a second inversion chamber 728 inverts the electrostatic chuck 600, which has passed through the deposition unit 730 while the substrate 500 is disposed on the electrostatic chuck 600, and then moves the electrostatic chuck 600 on which the substrate 500 is disposed into an ejection chamber 726. Then, an ejection robot 724 removes the electrostatic chuck 600 on which the substrate 500 is disposed from the ejection chamber 726, separates the substrate 500 from the electrostatic chuck 600, and then loads the substrate 500 onto the second rack 722. The electrostatic chuck 600 separated from the substrate 500 is returned back into the loading unit 710 via the second conveyor unit 620.

However, the present invention is not limited to the above description. For example, when disposing the substrate 500 on the electrostatic chuck 600, the substrate 500 may be fixed onto a bottom surface of the electrostatic chuck 600 and then moved into the deposition unit 730. In this case, for example, the first inversion chamber 718 and the first inversion robot 719, and the second inversion chamber 728 and the second inversion robot 729 are not used.

The deposition unit 730 may include at least one deposition chamber. As illustrated in FIG. 1, the deposition unit 730 may include a first chamber 731. In the embodiment illustrated in FIG. 1, first to four organic layer deposition assemblies 100, 200, 300, and 400 may be disposed in the first chamber 731. Although FIG. 1 illustrates that a total of four organic layer deposition assemblies, i.e., the first to fourth organic layer deposition assemblies 100 to 400, are installed in the first chamber 731, the total number of organic layer deposition assemblies that may be installed in the first chamber 731 may vary according to the deposition material and deposition conditions. The first chamber 731 is maintained in a vacuum state during a deposition process.

In the organic layer deposition apparatus illustrated in FIG. 2, a deposition unit 730 may include the first chamber 731 and a second chamber 732 that are connected to each other. In the embodiment illustrated in FIG. 2, the first and second organic layer deposition assemblies 100 and 200 may be disposed in the first chamber 731, and the third and fourth organic layer deposition assemblies 300 and 400 may be disposed in the second chamber 732. In other embodiments, the organic layer deposition system may include more than two chambers.

In the embodiment illustrated in FIG. 1, the electrostatic chuck 600 on which the substrate 500 is disposed may be moved at least to the deposition unit 730 or may be moved sequentially to the loading unit 710, the deposition unit 730, and the unloading unit 720, by the first conveyor unit 610. The electrostatic chuck 600 that is separated from the substrate 500 in the unloading unit 720 is moved back to the loading unit 710 by the second conveyor unit 620.

Figure 4:
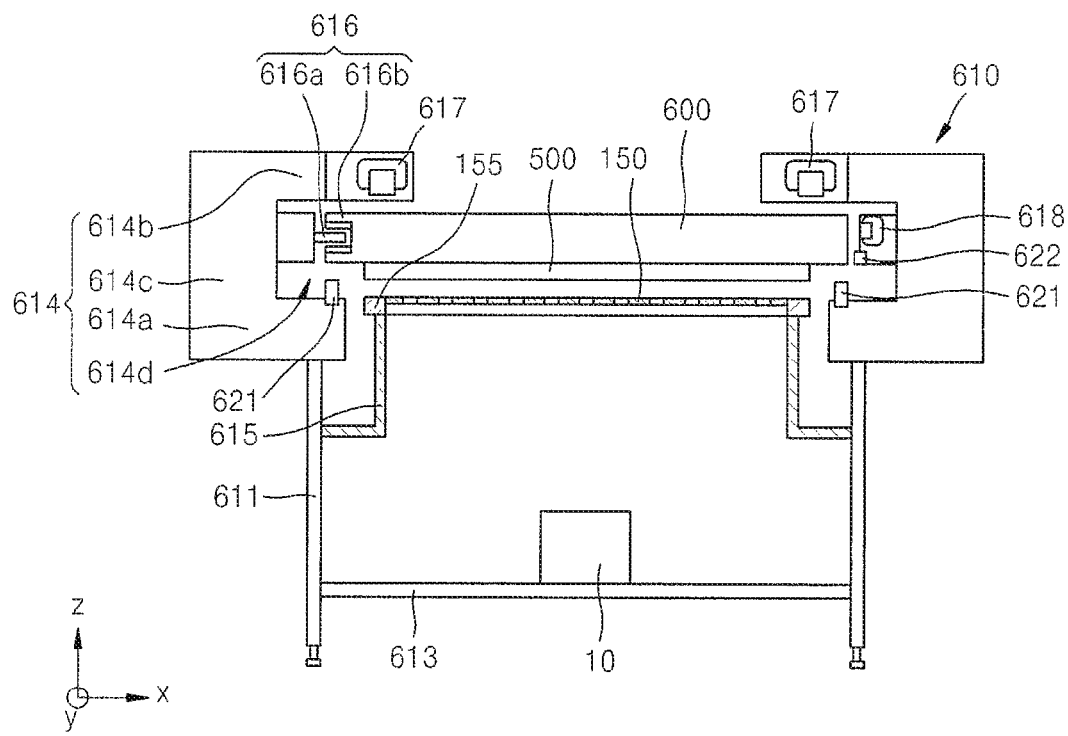
FIG. 4 is a cross-sectional view of a first conveyor unit according to an embodiment of the present invention.

FIG. 4 is a cross-sectional view of the first conveyor unit 610, according to an embodiment of the present invention.

The first conveyor unit 610 moves the electrostatic chuck 600 that is fixedly supporting the substrate. The first conveyor unit 610 may include a frame 611, a lower plate 613, a first guide unit 614, and a sheet support 615.

The frame 611 forms a base of the first conveyor unit 610. The frame 611 may be substantially in the form of an empty box. The lower plate 613 forms a lower side of the frame 611. A deposition source 10 may be disposed on the lower plate 613.

The frame 611 and the lower plate 613 may be formed as separate units, which may then be combined together. In one embodiment, the frame 611 and the lower plate 613 are integrally (originally) formed as one body.

Although not illustrated, the lower plate 613 with the deposition source 10 thereon may be formed as a cassette-like structure to be withdrawn out of the frame 611, which may facilitate replacement of the deposition source 10.

The sheet support 615 may be formed to protrude from an inner sidewall of the frame 611. The sheet support 615 may support the pattering slit sheet 150. The sheet support 615 may guide a deposition material discharged through deposition source nozzles to move straight, and not to flow in the X-axis direction.

The first guide unit 614 may be disposed on the frame 611, and may guide the electrostatic chuck 600 to move in a direction. The first guide unit 614 is disposed to pass through the first chamber 731 of the deposition unit 730.

The first guide unit 614 receives the opposite edges of the electrostatic chuck 600 to guide the movement of the electrostatic chuck 600. The first guide unit 614 may include a first receiving member 614a and a second receiving member 614b respectively disposed under and above the electrostatic chuck 600, and a connection member 614c connecting the first receiving member 614a and the second receiving member 614b. The first receiving member 614a, the second receiving member 614b, and the connection member 614c define a receiving groove 614d together. One side of the electrostatic chuck 600 is accommodated in the receiving grooves 614d and is moved along the receiving grooves 614d.

A driving unit 616 is disposed at a side of the connection member 614c in the receiving groove 614d to correspond to one side of the electrostatic chuck 600, and a side magnetic levitation bearing 618 is disposed to correspond to the other side of the electrostatic chuck 600 opposite to (facing oppositely way from) the driving unit 616. In one embodiment, the side magnetic levitation bearing 618 includes a magnet selected from the group consisting of electromagnets, permanent magnets, superconducting magnets, and combinations thereof.

Here, the driving unit 616 may be a linear motor. Linear motors have a low friction coefficient relative to existing sliding guide systems and a very high level of position spotting with almost no positional error. A linear motor acting as the driving unit 616 may include a coil 616a and a magnetic rail 616b. The coil 616a is disposed on one side of the connection member 614c of the first guide unit 614, and the magnetic rail 616b is disposed at a side of the electrostatic chuck 600 to correspond to the coil 616a. Since the magnetic rail 616b, not the coil 616a, is disposed on the moving electrostatic chuck 600, the electrostatic chuck 600 may be driven without applying power.

The side magnetic levitation bearing 618 is disposed at (on) the connection member 614c of the first guide unit 614 to correspond to the other side of the electrostatic chuck 600 opposite to the driving unit 616. The side magnetic levitation bearing 618 provides a gap between the electrostatic chuck 600 and the first guide unit 614, thereby allowing the electrostatic chuck 600 to move not in contact with and along the first guide unit 614.

An upper (top) magnetic levitation bearing 617 may be disposed at (on) the second receiving member 614b to be above the electrostatic chuck 600. The upper magnetic levitation bearing 617 enables the electrostatic chuck 600 to move along the first guide unit 614 not to contact the first receiving member 614a and the second receiving member 614b with a constant interval therefrom. Although not illustrated, a magnetic levitation bearing may be disposed at (on) the first receiving member 614a to correspond to a bottom side of the electrostatic chuck 600. In one embodiment, the upper magnetic levitation bearing 617 includes a magnet selected from the group consisting of electromagnets, permanent magnets, superconducting magnets, and combinations thereof.

The first guide unit 614 may further include a gap sensor 621. The gap sensor 621 may measure a gap between the electrostatic chuck 600 and the first guide unit 614. Referring to FIG. 4, the gap sensor 621 may be disposed at (on) the first receiving member 614a to correspond to a bottom side of the electrostatic chuck 600. The gap sensor 621 at (on) the first receiving member 614a may measure a gap between the first receiving member 614a and the electrostatic chuck 600. A gap sensor 622 may be disposed on the side magnetic levitation bearing 618. The gap sensor 622 disposed on the side magnetic levitation bearing 618 may measure a gap between a side of the electrostatic chuck 600 and the side magnetic levitation bearing 618. However, aspects of the present invention are not limited thereto. The gap sensor 622 may be disposed on the connection member 614c.

Magnetic forces of the upper and side magnetic levitation bearings 617 and 618 are changed according to the gaps measured by the gap sensors 621 and 622, thereby adjusting in real time a gap between the electrostatic chuck 600 and the first guide unit 614. The electrostatic chuck 600 may be precisely moved by a feedback control using the upper (top) and side magnetic levitation bearings 617 and 618 and the gap sensors 621 and 622.

Figure 5:
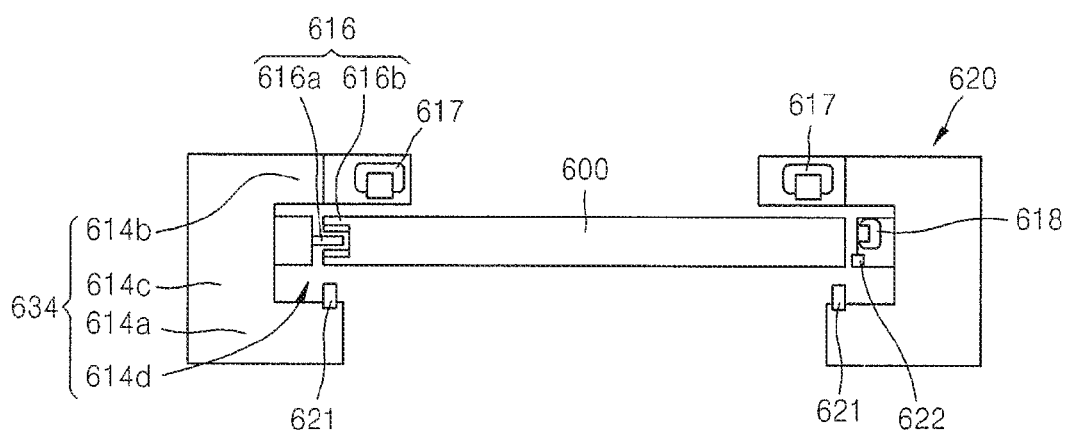
FIG. 5 is a cross-sectional view of a second conveyor unit according to an embodiment of the present invention.

FIG. 5 is a cross-sectional view of the second conveyor unit 620, according to an embodiment of the present invention.

The second conveyor unit 620 may include a second guide unit 634 for moving the electrostatic chuck 600 from which the substrate 500 has been removed.

The second guide unit 634 may include a first receiving member 614a, a second receiving member 614b, and a connection member 614c. The electrostatic chuck 600 is accommodated in receiving grooves 614d defined by the first receiving member 614a, the second receiving member 614b, and the connection member 614c, and is moved along the receiving grooves 614d.

The driving unit 616 is disposed at (on) the connection member 614c to correspond to one side of the electrostatic chuck 600. The driving unit 616 generates a driving force for moving the electrostatic chuck 600 along the second guide unit 634. The driving unit 616 may be a linear motor, which may include a coil 616*a* disposed on the connection member 614*c* and a magnetic rail 616*b* disposed on one side of the electrostatic chuck 600 to correspond to the coil 616*a*.

The side magnetic levitation bearing 618 is disposed at (on) the connection member 614*c* of the first guide unit 614 to correspond to the other side of the electrostatic chuck 600 opposite to the driving unit 616. The upper magnetic levitation bearing 617 may be disposed at (on) the second receiving member 614*b* to be above the electrostatic chuck 600. The upper (top) and side magnetic levitation bearings 617 and 618 provide a gap between the electrostatic chuck 600 and the first guide unit 614, thereby allowing the electrostatic chuck 600 to move not in contact with and along the first guide unit 614.

The second conveyor unit 620 may further include gap sensors 621 and 622 for measuring a gap between the electrostatic chuck 600 and the second guide unit 634. The gap sensor 621 may be disposed at (on) the first receiving member 614*a* to correspond to a bottom side of the electrostatic chuck 600. The gap sensor 622 may be disposed on the side magnetic levitation bearing 618 to correspond to a side of the electrostatic chuck 600.

Figure 6:
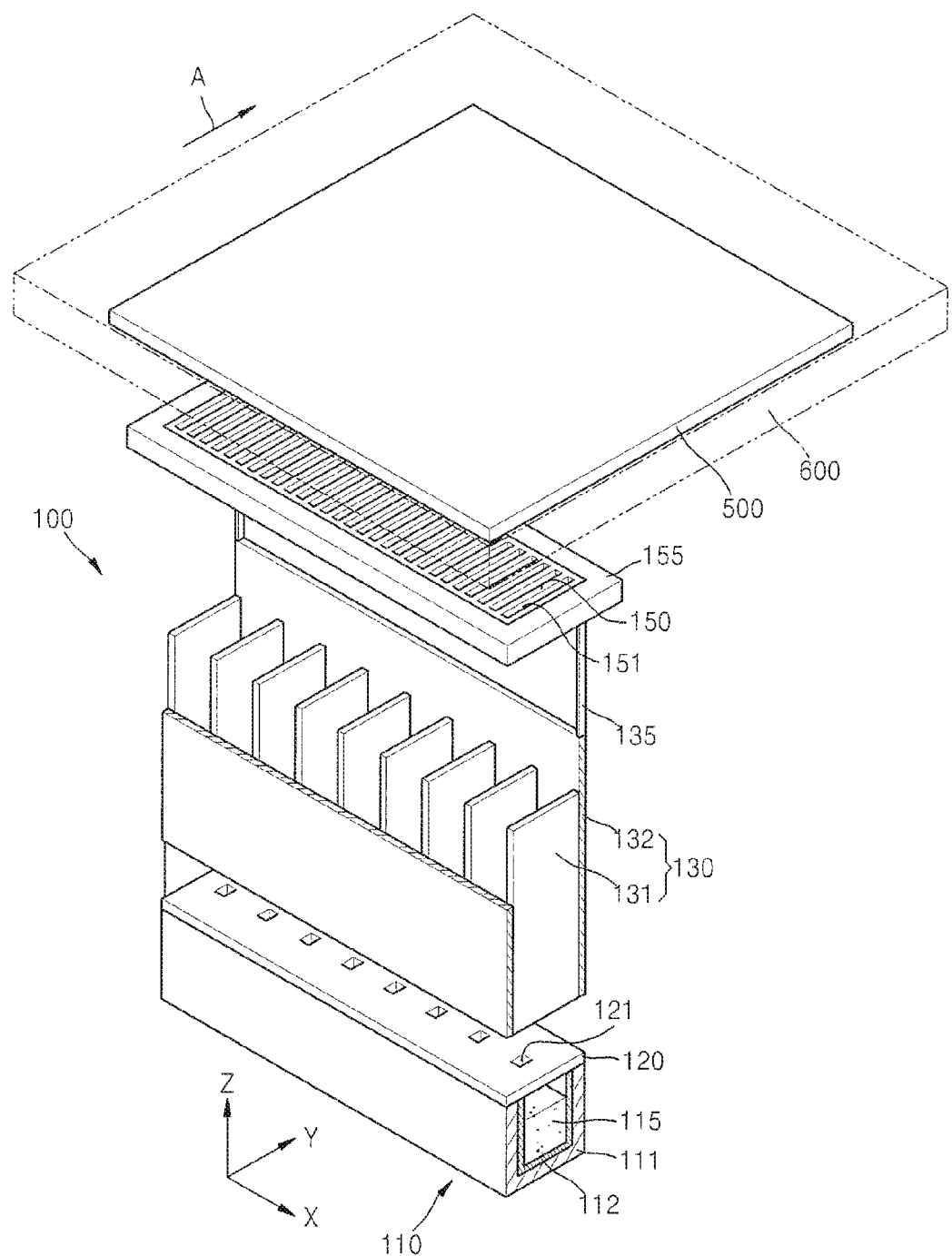
FIG. 6 is a schematic perspective cutaway view of an organic layer deposition assembly of the organic layer deposition apparatus of FIG. 1, according to an embodiment of the present invention.

Hereinafter, an embodiment of the organic layer deposition assembly 100 of the organic layer deposition apparatus described above will be described. FIG. 6 is a schematic perspective cutaway view of the organic layer deposition assembly 100 of the organic layer deposition apparatus of FIG. 1, FIG. 7 is a cross-sectional side view of the organic layer deposition assembly 100 illustrated in FIG. 6, and FIG. 8 is a cross-sectional plan view of the organic layer deposition assembly 100 illustrated in FIG. 6.

Figure 7:
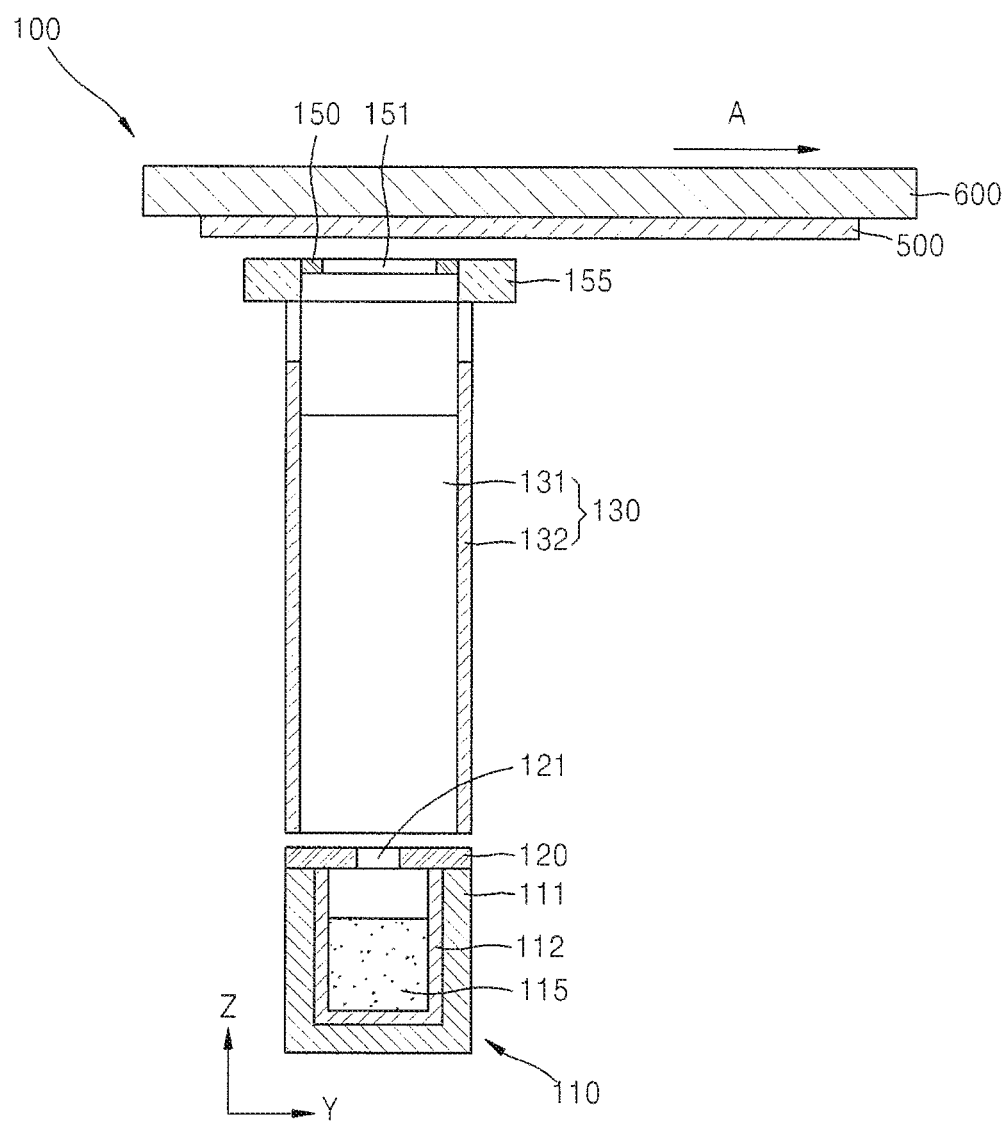
FIG. 7 is a schematic sectional side view of the organic layer deposition assembly of FIG. 6, according to an embodiment of the present invention.
Figure 8:
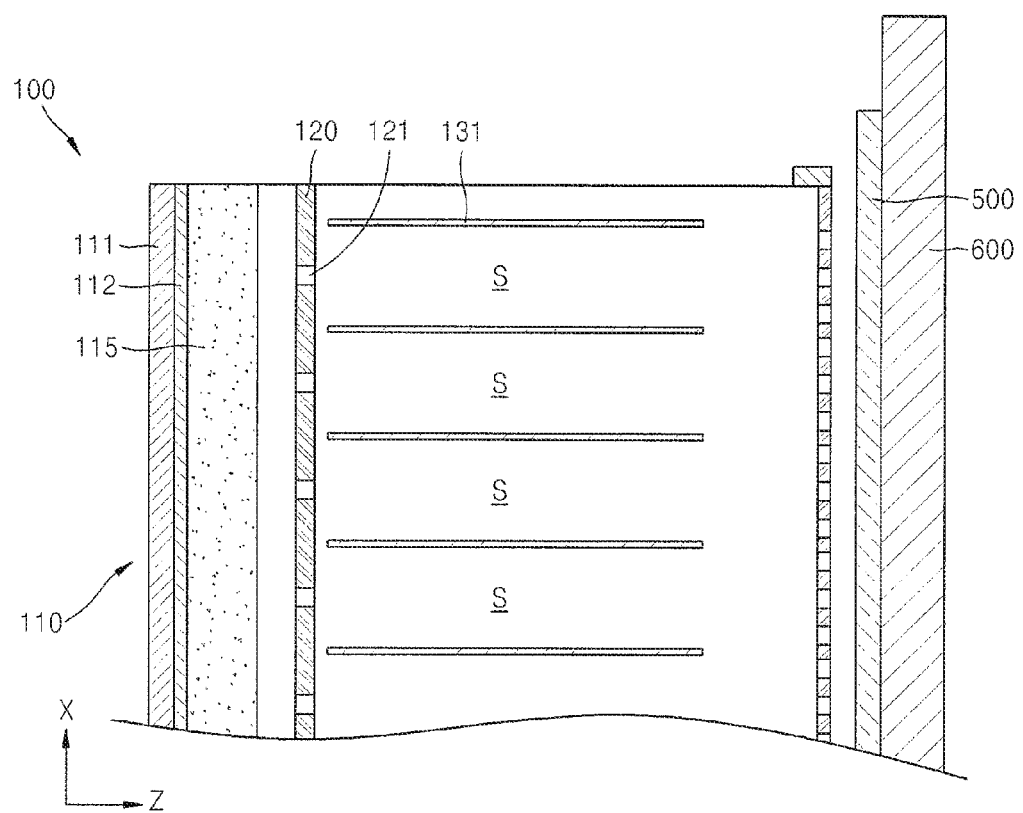
FIG. 8 is a schematic sectional view in an XZ plane of the organic layer deposition assembly of FIG. 6, according to an embodiment of the present invention.

Referring to FIGS. 6 to 8, the organic layer deposition assembly 100 according to the current embodiment of the present invention includes a deposition source 110, a deposition source nozzle unit 120, a barrier plate assembly 130, and a patterning slit sheet 150.

Although a chamber is not illustrated in FIGS. 6 to 8 for convenience of explanation, all the components of the organic layer deposition assembly 100 may be disposed within a chamber that is maintained at an appropriate degree of vacuum. The chamber is maintained at an appropriate vacuum in order to allow a deposition material to move substantially in a straight line in the organic layer deposition assembly 100.

In the chamber 731 of FIG. 1 in which the organic layer deposition assembly 100 is disposed, the substrate 500, which constitutes a deposition target on which the deposition material 115 is to be deposited, is transferred by the electrostatic chuck 600. The substrate 500 may be a substrate for flat panel displays. A large substrate, such as a mother glass, for manufacturing a plurality of flat panel displays, may be used as the substrate 500.

In an embodiment, the substrate 500 or the organic layer deposition assembly 100 may be moved relative to the other. For example, as illustrated in FIG. 6, the substrate 500 may be moved in a direction of an arrow A, relative to the organic layer deposition assembly 100.

In a conventional deposition method using a fine metal mask (FMM), the size of the FMM is greater than or equal to the size of a substrate. Thus, the size of the FMM has to be increased when performing deposition on a larger substrate. However, it is difficult to manufacture a large FMM and to extend an FMM to be accurately aligned with a pattern.

To overcome this problem, in the organic layer deposition assembly 100 according to the current embodiment of the present invention, deposition may be performed while the organic layer deposition assembly 100 or the substrate 500 is moved relative to the other. In other words, deposition may be continuously performed while the substrate 500, which is disposed such as to face the organic layer deposition assembly 100, is moved in a Y-axis direction. In other words, the deposition is performed in a scanning manner while the substrate 500 is moved in a direction of arrow A in FIG. 6. Although the substrate 500 is illustrated as being moved in the Y-axis direction in FIG. 6 in the chamber 731 (FIG. 1) when deposition is performed, the present invention is not limited thereto. Deposition may be performed while the organic layer deposition assembly 100 is moved in the Y-axis direction, while the substrate 500 is fixed.

Thus, in the organic layer deposition assembly 100 according to the current embodiment of the present invention, the patterning slit sheet 150 may be significantly smaller than an FMM used in a conventional deposition method. In other words, in the organic layer deposition assembly 100, deposition is continuously performed, i.e., in a scanning manner while the substrate 500 is moved in the Y-axis direction. Thus, a length of the patterning slit sheet 150 in the Y-axis direction may be significantly less than a length of the substrate 500 in the Y-axis direction. Here, a width of the patterning slit sheet 150 in the X-axis direction and a width of the substrate 500 in the X-axis direction are substantially equal to each other. However, even when the width of the patterning slit sheet 150 in the X-axis direction is less than the width of the substrate 500 in the X-axis direction, deposition may be performed on the entire substrate 500 in a scanning manner while the substrate 500 or the organic layer deposition assembly 100 is moved relative to the other.

As described above, since the patterning slit sheet 150 may be formed to be significantly smaller than an FMM used in a conventional deposition method, it is relatively easy to manufacture the patterning slit sheet 150 used in the present invention. In other words, using the patterning slit sheet 150, which is smaller than an FMM used in a conventional deposition method, is more convenient in all processes, including etching and other subsequent processes, such as precise extension, welding, moving, and cleaning processes, compared to the conventional deposition method using the larger FMM. This is more advantageous for manufacturing a relatively large display device.

In order to perform deposition while the organic layer deposition assembly 100 or the substrate 500 is moved relative to the other as described above, the organic layer deposition assembly 100 and the substrate 500 may be separated from each other by a set or predetermined distance. This will be described later in more detail.

The deposition source 110 that contains and heats the deposition material 115 is disposed at (on) an opposite side of the chamber to a side at (on) which the substrate 500 is disposed.

The deposition source 110 includes a crucible 112 that is filled with the deposition material 115, and a cooling block 111 surrounding the crucible 112. The cooling block 111 reduces or prevents radiation of heat from the crucible 112 to the outside, i.e., into the chamber (e.g., the chamber 731 and/or the chamber 732). The cooling block 111 may include a heater that heats the crucible 112.

The deposition source nozzle unit 120 is disposed at a side of the deposition source 110, and in particular, at the side of the deposition source 110 facing the substrate 500. The deposition source nozzle unit 120 includes a plurality of deposition source nozzles 121 arranged at equal intervals in the X-axis direction. The deposition material 115 that is vaporized in the deposition source 110 passes through the deposition source nozzles 121 of the deposition source nozzle unit 120 towards the substrate 500, which is a deposition target on which the deposition material 115 is to be deposited.

The barrier plate assembly 130 is disposed at a side of the deposition source nozzle unit 120. The barrier plate assembly 130 includes a plurality of barrier plates 131, and a barrier plate frame 132 that covers sides of the barrier plates 131. The plurality of barrier plates 131 may be arranged parallel to each other at equal intervals in the X-axis direction. In addition, each of the barrier plates 131 may be arranged parallel to an YZ plane in FIG. 4, and may have a rectangular shape. The plurality of barrier plates 131 arranged as described above, partition the space between the deposition source nozzle unit 120 and the patterning slit sheet 150 into a plurality of sub-deposition spaces S (see FIG. 8). In the organic layer deposition assembly 100 according to the current embodiment of the present invention, as illustrated in FIG. 5, the deposition space is divided by the barrier plates 131 into the sub-deposition spaces S that respectively correspond to the deposition source nozzles 121 through which the deposition material 115 is discharged.

The barrier plates 131 may be respectively disposed between adjacent deposition source nozzles 121. In other words, each of the deposition source nozzles 121 may be disposed between two adjacent barrier plates 131. The deposition source nozzles 121 may be respectively located at the midpoint between two adjacent barrier plates 131. However, the present invention is not limited to this structure. For example, a plurality of deposition source nozzles 121 may be disposed between two adjacent barrier plates 131. In this case, the deposition source nozzles 121 may be also respectively located at the midpoint between two adjacent barrier plates 131.

As described above, since the barrier plates 131 partition the space between the deposition source nozzle unit 120 and the patterning slit sheet 150 into the plurality of sub-deposition spaces S, the deposition material 115 discharged through each of the deposition source nozzles 121 is not mixed with the deposition material 115 discharged through the other deposition source nozzles 121, and passes through the patterning slits 151 so as to be deposited on the substrate 500. In other words, the barrier plates 131 guide the deposition material 115, which is discharged through the deposition source nozzles 121, to move straight, i.e., to flow in the Z-axis direction.

As described above, the deposition material 115 is forced or guided to move straight by installing the barrier plates 131, so that a smaller shadow zone may be formed on the substrate 500, compared to a case where no barrier plates are installed. Thus, the organic layer deposition assembly 100 and the substrate 500 may be separated from each other by a set or predetermined distance, as will be described later in detail. This will be described later in detail.

The patterning slit sheet 150 and a frame 155 in which the patterning slit sheet 150 is bound are disposed between the deposition source 110 and the substrate 500. The frame 155 may be formed to have a lattice shape, similar to a window frame. The patterning slit sheet 150 includes a plurality of patterning slits 151 arranged in the X-axis direction. The patterning slits 151 extend in the Y-axis direction. The deposition material 115 that has been vaporized in the deposition source 110 and passed through the deposition source nozzle 121, passes through the patterning slits 151 towards the substrate 500.

The patterning slit sheet 150 may be formed of a metal thin film. The patterning slit sheet 150 is fixed to the frame 155 such that a tensile force is exerted thereon. The patterning slits 151 may be formed by etching the patterning slit sheet 150 to have a stripe pattern. The number of patterning slits 151 may be equal to the number of deposition patterns to be formed on the substrate 500.

In addition, the barrier plate assembly 130 and the patterning slit sheet 150 may be disposed to be separated from each other by a set or predetermined distance. Alternatively, the barrier plate assembly 130 and the patterning slit sheet 150 may be connected by (via) a connection member 135.

As described above, the organic layer deposition assembly 100 according to the current embodiment of the present invention performs deposition while being moved relative to the substrate 500. In order to move the organic layer deposition assembly 100 relative to the substrate 500, the patterning slit sheet 150 may be spaced apart from the substrate 500 by a set or predetermined distance. In addition, to prevent the formation of a relatively large shadow zone on the substrate 500 when the patterning slit sheet 150 and the substrate 500 are spaced apart from each other, the barrier plates 131 are arranged between the deposition source nozzle unit 120 and the patterning slit sheet 150 to force or guide the deposition material 115 to move in a straight direction. Thus, the size of the shadow zone that may be formed on the substrate 500 is sharply reduced.

In a typical deposition method using an FMM, deposition is performed with the FMM in close contact with a substrate in order to prevent formation of a shadow zone on the substrate. However, when the FMM is used in close contact with the substrate, the contact may cause defects, such as scratches on patterns formed on the substrate. In addition, in the typical deposition method, the size of the mask has to be the same as the size of the substrate since the mask may not be moved relative to the substrate. Thus, the size of the mask has to be increased as display devices become larger. However, it is not easy to manufacture such a large mask.

In order to overcome this and/or other problems, in the organic layer deposition assembly 100 according to the current embodiment of the present invention, the patterning slit sheet 150 is disposed to be spaced apart from the substrate 500 by a set or predetermined distance, which may be facilitated by installing the barrier plates 131 to reduce the size of the shadow zone formed on the substrate 500. Shadow zones on the substrate 500 may be reduced or minimized by installing the barrier plates 131.

Thin films such as organic layers (refer to the organic layer 63 in FIG. 10) of an organic light-emitting display device may be formed using any suitable organic layer deposition apparatus having the structure described above.

Figure 9:
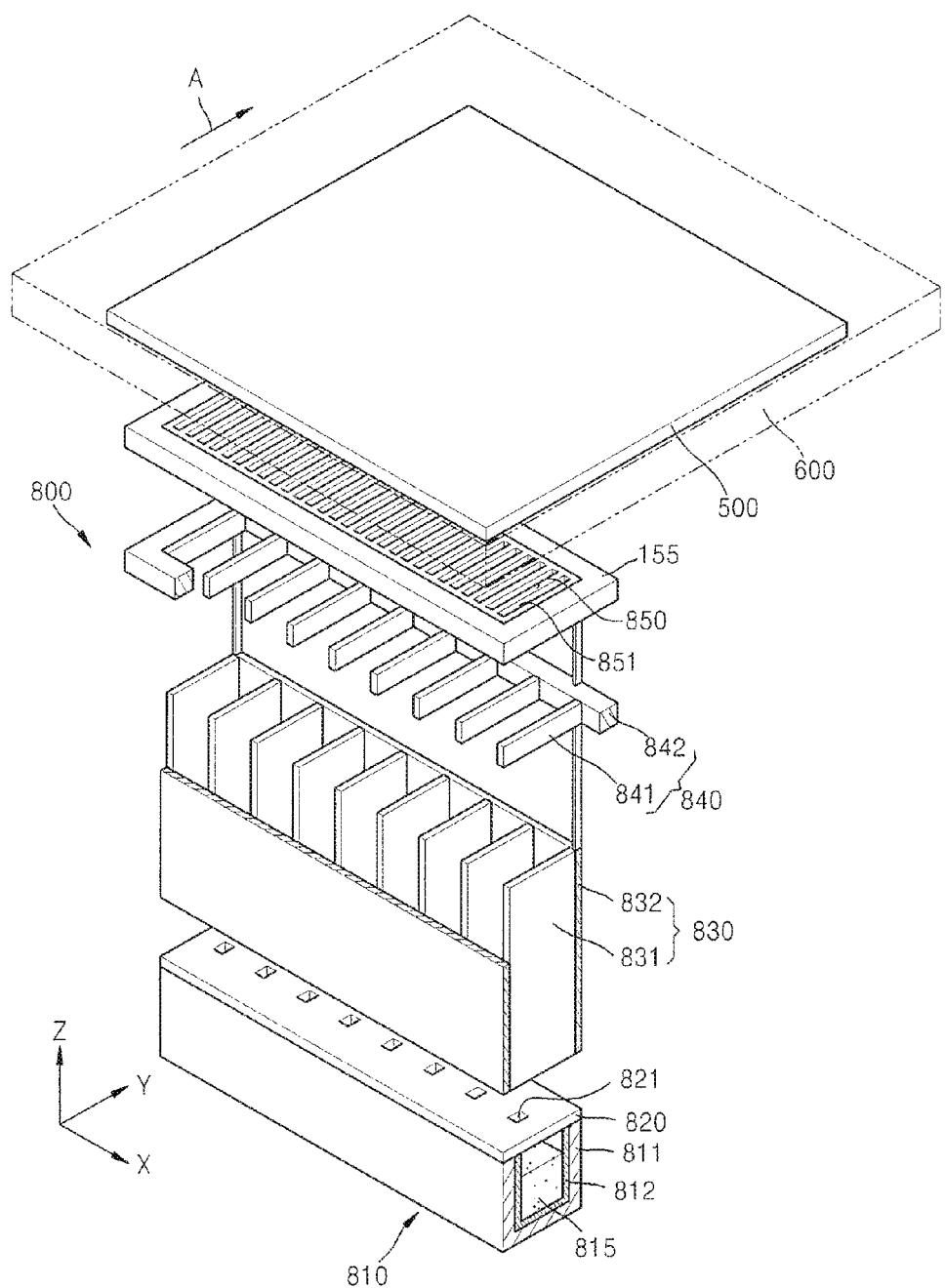
FIG. 9 is a schematic perspective cutaway view of an organic layer deposition assembly according to another embodiment of the present invention.

FIG. 9 is a schematic perspective cutaway view of an organic layer deposition assembly 800 according to another embodiment of the present invention.

Referring to FIG. 9, the organic layer deposition assembly 800 according to the current embodiment of the present invention includes a deposition source 810, a deposition source nozzle unit 820, a first barrier plate assembly 830, a second barrier plate assembly 840, and a patterning slit sheet 850. Structures of the deposition source 810, the first barrier plate assembly 830, and the patterning slit sheet 850 are the same as those in the embodiment described with reference to FIG. 6, and thus a detailed description thereof will not be provided here. The current embodiment differs from the previous embodiment in that the second barrier plate assembly 840 is disposed at a side of the first barrier plate assembly 830.

The second barrier plate assembly 840 includes a plurality of second barrier plates 841, and a second barrier plate frame 841 that covers sides of the second barrier plates 842. The plurality of second barrier plates 841 may be arranged parallel to each other at equal intervals in the X-axis direction. In addition, each of the second barrier plates 841 may be formed to extend parallel to the YZ plane in FIG. 10, i.e., perpendicular to the X-axis direction.

The plurality of first barrier plates 831 and second barrier plates 841 arranged as described above, partition the space between the deposition source nozzle unit 820 and the patterning slit sheet 850. The deposition space is divided by the first barrier plates 831 and the second barrier plates 841 into sub-deposition spaces that respectively correspond to the deposition source nozzles 821 through which the deposition material 115 is discharged.

The second barrier plates 841 may be disposed to correspond respectively to the first barrier plates 831. In other words, the second barrier plates 841 may be respectively disposed to be parallel to and to be on the same plane as the first barrier plates 831. Each pair of the corresponding first and second barrier plates 831 and 841 may be located on the same plane. Although the first barrier plates 831 and the second barrier plates 841 are respectively illustrated as having the same thickness in the X-axis direction, aspects of the present invention are not limited thereto. In other words, the second barrier plates 841, which need to be accurately aligned with the patterning slits 851, may be formed to be relatively thin, whereas the first barrier plates 831, which do not need to be precisely aligned with the patterning slits 151, may be formed to be relatively thick. This makes it easier to manufacture the organic layer deposition assembly.

Figure 10:
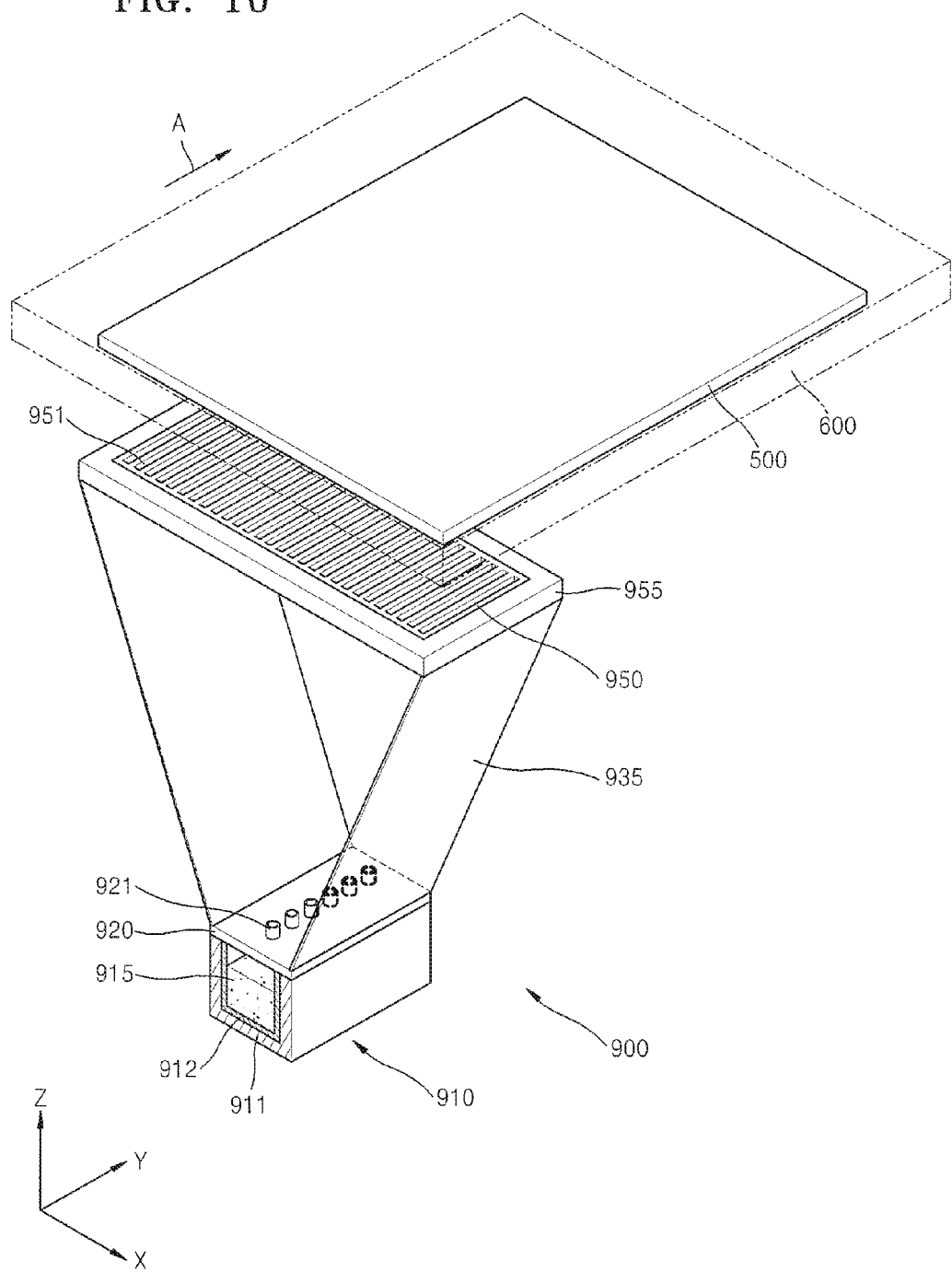
FIG. 10 is a schematic perspective view of an organic layer deposition assembly according to another embodiment of the present invention.

FIG. 10 is a schematic perspective view of an organic layer deposition assembly 900 according to another embodiment of the present invention.

Referring to FIG. 10, the organic layer deposition assembly 900 according to the current embodiment includes a deposition source 910, a deposition source nozzle unit 920, and a patterning slit sheet 950.

In particular, the deposition source 910 includes a crucible 911 that is filled with the deposition material 915, a cooling block 912 surrounding the crucible 911, and a heater that may be in the cooling block 912. The heater heats the crucible 911 to vaporize the deposition material 915, which is contained in the crucible 911, so as to move the vaporized deposition material 915 to the deposition source nozzle unit 920. The deposition source nozzle unit 920, which has a planar shape, is disposed at a side of the deposition source 910. The deposition source nozzle unit 920 includes a plurality of deposition source nozzles 921 arranged in the Y-axis direction. The patterning slit sheet 950 and a frame 955 are further disposed between the deposition source 910 and the substrate 500. The patterning slit sheet 950 includes a plurality of patterning slits 951 arranged in the X-axis direction. In addition, the deposition source 910 and the deposition source nozzle unit 920 may be connected to the patterning slit sheet 950 by a connection member 935.

The current embodiment of FIG. 10 differs from the previous embodiments in the arrangement of the plurality of deposition source nozzles in the deposition source nozzle unit 920, which will now be described in more detail.

The deposition source nozzle unit 920 is disposed at a side of the deposition source 910, and in particular, at the side of the deposition source 910 facing the substrate 500. The deposition source nozzle unit 920 includes a plurality of deposition source nozzles 921 arranged at equal intervals in the Y-axis direction, i.e., a scanning direction of the substrate 500. The deposition material 915 that is vaporized in the deposition source 910 passes through the deposition source nozzle unit 920 towards the substrate 500. As described above, when the deposition source nozzle unit 920 includes the plurality of deposition source nozzles 921 arranged in the Y-axis direction, that is, the scanning direction of the substrate 500, the size of a pattern formed of the deposition material discharged through the patterning slits 951 of the patterning slit sheet 950 is affected by the size of one of the deposition source nozzles 921 (since there is only one line of deposition nozzles in the X-axis direction), and thus no shadow zone may be formed on the substrate 500. In addition, since the plurality of deposition source nozzles 921 are arranged in the scanning direction of the substrate 500, even when there is a difference in flux between the deposition source nozzles 921, the difference may be compensated for and deposition uniformity may be maintained constant.

Figure 11:
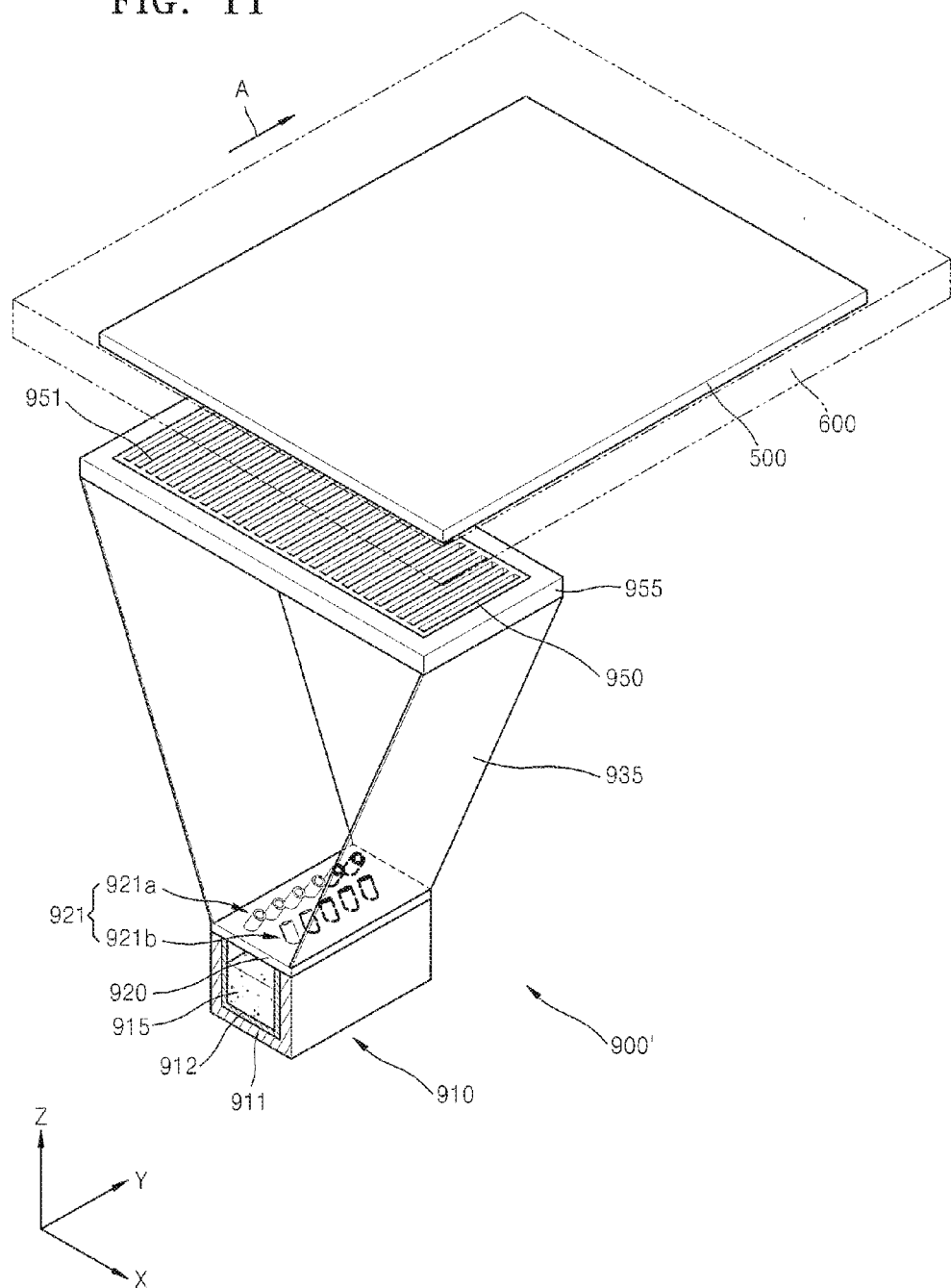
FIG. 11 is a schematic perspective view of an organic layer deposition assembly according to another embodiment of the present invention.

FIG. 11 is a schematic perspective view of an organic layer deposition assembly 900' according to another embodiment of the present invention. Referring to FIG. 11, the organic layer deposition assembly 900' according to the current embodiment includes a deposition source 910, a deposition source nozzle unit 920, and a patterning slit sheet 950.

The current embodiment differs from the previous embodiments in that a plurality of deposition source nozzles 921 formed in the deposition source nozzle unit 920 are tilted at a set or predetermined angle. In particular, the deposition source nozzles 921 may include deposition source nozzles 921a and 921b arranged in respective rows. The deposition source nozzles 921a and 921b may be arranged in respective rows to alternate in a zigzag pattern. The deposition source nozzles 921a and 921b may be tilted by a set or predetermined angle with respect to an XZ plane.

Therefore, in the current embodiment of the present invention, the deposition source nozzles 921a and 921b are arranged to tilt by a set or predetermined angle to each other. The deposition source nozzles 921a of a first row and the deposition source nozzles 921b of a second row may tilt to face each other. That is, the deposition source nozzles 921a of the first row in a left part of the deposition source nozzle unit 920 may tilt to face a right side portion of the patterning slit sheet 950, and the deposition source nozzles 921b of the second row in a right part of the deposition source nozzle unit 920 may tilt to face a left side portion of the patterning slit sheet 950.

Due to the structure of the organic layer deposition assembly 900' according to the current embodiment, the deposition of the deposition material 915 may be adjusted to lessen a thickness variation between the center and the end portions of the substrate 500 and improve thickness uniformity of the deposition film. Moreover, utilization efficiency of the deposition material 915 may also be improved.

Figure 12:
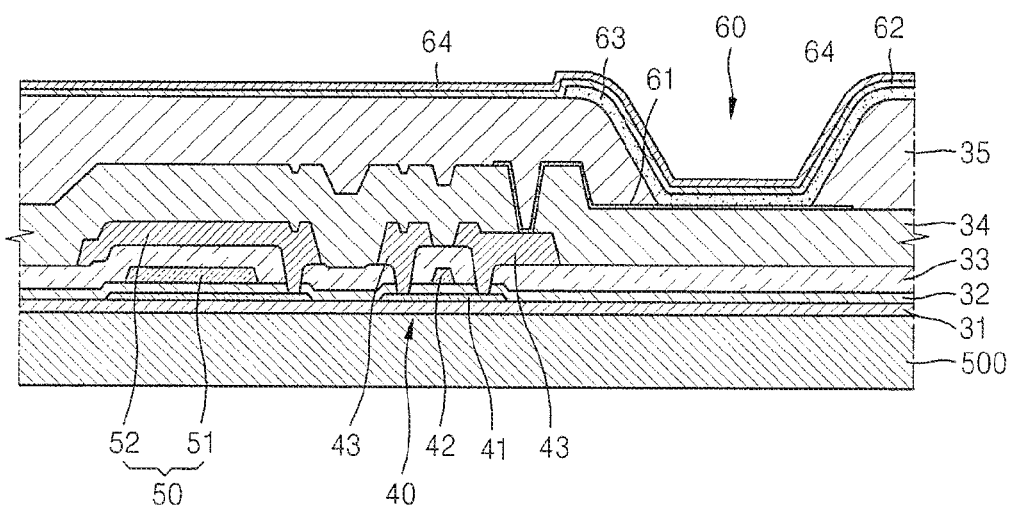
FIG. 12 is a cross-sectional view of an active matrix organic light-emitting display device fabricated by using an organic layer deposition apparatus, according to an embodiment of the present invention.

FIG. 12 is a cross-sectional view of an active matrix organic light-emitting display device fabricated by using an organic layer deposition apparatus, according to an embodiment of the present invention.

Referring to FIG. 12, the active matrix organic light-emitting display device according to the current embodiment is formed on a substrate 500. The substrate 500 may be formed of a transparent material, for example, glass, plastic, or metal. An insulating layer 31, such as a buffer layer, is formed on an entire surface of the substrate 500.

A thin film transistor (TFT) 40, a capacitor 50, and an organic light-emitting diode (OLED) are disposed on the insulating layer 31, as illustrated in FIG. 12. Here, the capacitor 50 includes a first capacitor electrode 51 and a second capacitor electrode 52.

A semiconductor active layer 41 is formed on an upper surface of the insulating layer 31 in a set or predetermined pattern. A gate insulating layer 32 is formed to cover the semiconductor active layer 41. The semiconductor active layer 41 may include a p-type or n-type semiconductor material.

A gate electrode 42 of the TFT 40 is formed in a region of the gate insulating layer 32 corresponding to the semiconductor active layer 41. An interlayer insulating layer 33 is formed to cover the gate electrode 42. The interlayer insulating layer 33 and the gate insulating layer 32 are etched by, for example, dry etching, to form a contact hole exposing parts of the semiconductor active layer 41. In addition, the interlayer insulating layer 33 is formed (patterned) to be between the first capacitor electrode 51 and the second capacitor electrode 52.

A source/drain electrode 43 is formed on the interlayer insulating layer 33 to contact the semiconductor active layer 41 through the contact hole. A passivation layer 34 is formed to cover the source/drain electrode 43, and is etched to expose a part of the drain electrode 43. An insulating layer (not shown) may be further formed on the passivation layer 34 so as to planarize the passivation layer 34.

In addition, the OLED 60 displays a set or predetermined image information by emitting red, green, or blue light as current flows. The OLED 60 includes a first electrode 61 disposed on the passivation layer 34. The first electrode 61 is electrically connected to the drain electrode 43 of the TFT 40.

A pixel defining layer 35 is formed to cover the first electrode 61. An opening 65 is formed in the pixel defining layer 35, and then an organic layer 63, including an emission layer, is formed in a region defined by the opening 65. A second electrode 62 is formed on the organic layer 63.

The pixel defining layer 35, which defines individual pixels, is formed of an organic material. The pixel defining layer 35 also planarizes the surface of a region of the substrate 30 in which the first electrode 61 is formed, and in particular, the surface of the passivation layer 34.

The first electrode 61 and the second electrode 62 are insulated from each other, and respectively apply voltages of opposite polarities to the organic layer 63, including the emission layer, to induce light emission.

The organic layer 63, including an emission layer (EML), may be formed of a low-molecular weight organic material or a high-molecular weight organic material. When a low-molecular weight organic material is used, the organic layer 63 (including the emission layer) may have a single or multi-layer structure including at least one selected from the group consisting of a hole injection layer (HIL), a hole transport layer (HTL), the emission layer (EML), an electron transport layer (ETL), and an electron injection layer (EIL). Examples of available organic materials may include copper phthalocyanine (CuPc), N,N'-di(naphthalene-1-yl)-N,N'-diphenyl-benzidine (NPB), tris-8-hydroxyquinoline aluminum (Alq3), and the like.

After such an organic layer is formed, the second electrode 62 may be formed by the same deposition method as used to form the organic layer 63.

The first electrode 61 may function as an anode, and the second electrode 62 may function as a cathode. Alternatively, the first electrode 61 may function as a cathode, and the second electrode 62 may function as an anode. The first electrode 61 may be patterned to correspond to individual pixel regions, and the second electrode 62 may be formed to cover all the pixels.

The first electrode 61 may be formed as a transparent electrode or a reflective electrode. The transparent electrode may be formed of indium tin oxide (ITO), indium zinc oxide (IZO), zinc oxide (ZnO), and/or indium oxide ($In_2O_3$). The reflective electrode may be formed by forming a reflective layer from silver (Ag), magnesium (Mg), aluminum (Al), platinum (Pt), palladium (Pd), gold (Au), nickel (Ni), neodymium (Nd), iridium (Ir), chromium (Cr), or a compound thereof, and forming a layer of ITO, IZO, ZnO, and/or $In_2O_3$ on the reflective layer. The first electrode 61 may be formed by forming a layer by, for example, sputtering, and then patterning the layer by, for example, photolithography.

The second electrode 62 may also be formed as a transparent electrode or a reflective electrode. When the second electrode 62 is formed as a transparent electrode, the second electrode 62 functions as a cathode. To this end, such a transparent electrode may be formed by depositing a metal having a low work function, such as lithium (Li), calcium (Ca), lithium fluoride/calcium (LiF/Ca), lithium fluoride/aluminum (LiF/Al), aluminum (Al), silver (Ag), magnesium (Mg), or a compound thereof on a surface of the organic layer 63, including an emission layer, and forming an auxiliary electrode layer or a bus electrode line thereon from ITO, IZO, ZnO, $In_2O_3$, or the like. When the second electrode 62 is formed as a reflective electrode, the reflective layer may be formed by depositing Li, Ca, LiF/Ca, LiF/Al, Al, Ag, Mg, or a compound thereof on the entire surface of the organic layer 63. The second electrode 62 may be formed by using the same deposition method as used to form the organic layer 63, including an emission layer, described above.

A protective layer 64 may be further formed on the second electrode 62. The protective layer 64 formed on the second electrode 62 may serve as a mask in removing the organic layer 63 from non-pixel regions, and at the same time protect the second electrode 62.

Figure 13:
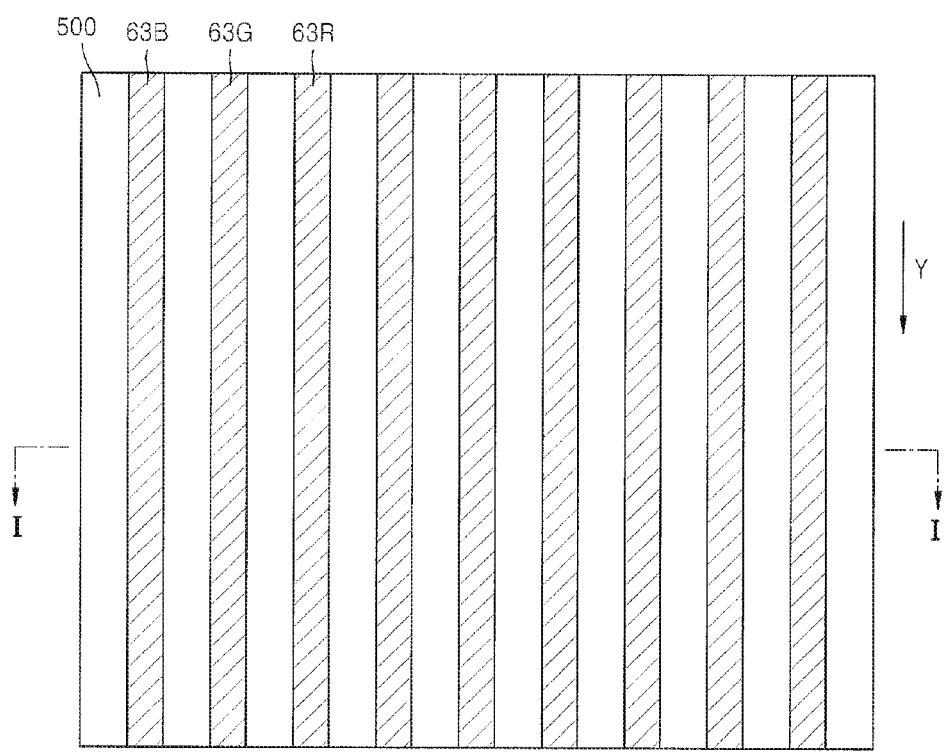
FIG. 13 is a plan view of one or more organic layers on a substrate, according to an embodiment of the present invention.

FIG. 13 is a plan view of one or more organic layers 63B, 63G, and 63R formed on a substrate 500, according to an embodiment of the present invention.

Referring to FIG. 13, the substrate 500 according to one embodiment has a size of at least 40 inches, and an organic layer 63B, 63G, and 63R is formed to have a linear pattern. That is, the organic layer 63B, 63G, and 63R is formed to have a plurality of linear stripes including a first or blue (B) stripe 63B, a second or green (G) stripe 63G, and a third or red (R) stripe 63R. The linear pattern of the organic layer 63B, 63G, and 63R is formed using any suitable one of the above described organic layer deposition apparatuses according to embodiments of the present invention. Here, the organic layer 63B, 63G, and 63R may include an emission layer (EML) for emitting a blue (B), green (G), or red (R) light. For example, the first or blue (B) stripe 63B includes the emission layer (EML) for emitting blue light, the second or green (G) stripe 63G includes the emission layer (EML) for emitting green light, and the third or red (R) stripe 63R includes the emission layer (EML) for emitting red light. Moreover, the organic layer 63B, 63G, and 63R may each further include a layer selected from the group consisting of a hole injection layer (HIL), a hole transport layer (HTL), an electron transport layer (ETL), an electron injection layer (EIL), and combinations thereof.

FIG. 14 is a cross-sectional view of the one or more layers formed on the substrate taken along line I-1 of FIG. 13, according to an embodiment of the present invention.

Referring now to FIG. 14, the organic layer is formed on the substrate 500 to have a non-uniform thickness. That is, a first portion P1 of the organic layer on the substrate 500 is shown to have a thickness or height of h1, a second portion P2 of the organic layer on the substrate 500 is shown to have a thickness or height of h2, a third portion P3 of the organic layer on the substrate 500 is shown to have a thickness or height of h3, a fourth portion P4 of the organic layer on the substrate 500 is shown to have a thickness or height of h4, and a fifth portion P5 of the organic layer on the substrate 500 is shown to have a thickness or height of h5. Here, the thickness h1 is greater than h2, the thickness h2 is greater than the thickness h3, the thickness h3 is greater than the thickness h4, and the thickness h4 is greater than the thickness h5. Also, the first, second, third, fourth, or fifth portion P1, P2, P3, P4, or P5 may be a cross-sectional portion of the first, second, or third stripe 63B, 63G, or 63R. That is, in one embodiment, the fifth portion P5 is the cross-sectional portion of the first stripe 63B, the fourth portion P4 is the cross-sectional portion of the second stripe 63G, and the third portion P3 is the cross-sectional portion of the third stripe 63R.

Here, the non-uniform thickness of the organic layer P1, P2, P3, P5, and P5 is formed using any suitable one of the above described organic layer deposition apparatuses according to embodiments of the present invention.

Moreover, the suitable organic layer deposition apparatus includes an organic layer deposition assembly that is composed to include a patterning slit sheet 150. That is, as shown in FIG. 14, the patterning slit sheet 150 of the organic layer deposition assembly is utilized to form the organic layer on the substrate 500. Here, the patterning slit sheet 150 is disposed to be spaced apart from the substrate 500 and is smaller than the substrate 500 in size. Moreover, in the deposition of the organic layer on the substrate 500 according to one embodiment, the patterning slit sheet 150 or the substrate 500 is configured to be moved relative to the other. As such, the organic layer is formed on the substrate 500 to have the linear pattern as shown in FIG. 13, and/or is formed to have the non-uniform thickness as shown in FIG. 14.

In view of the foregoing, the organic layer deposition apparatuses according to the embodiments of the present invention may be applied to form an organic layer or an inorganic layer of an organic TFT, and to form layers from various suitable materials.

Also, as described above, organic layer deposition apparatuses according to aspects of the present invention may be readily manufactured and may be simply applied to the manufacture of large-sized display devices on a mass scale. The organic layer deposition apparatuses may improve manufacturing yield and deposition efficiency.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An organic layer deposition apparatus comprising:
   an electrostatic chuck for supporting a substrate;
   a deposition unit comprising a chamber for maintaining a vacuum and an organic layer deposition assembly for depositing at least one organic layer on the substrate supported by the electrostatic chuck; and
   a first conveyor unit passing through the chamber and for moving the electrostatic chuck supporting the substrate into the deposition unit,
   wherein the first conveyor unit comprises a guide unit comprising a receiving member for supporting the electrostatic chuck to be movable in a direction while the electrostatic chuck is spaced apart from the first conveyor unit,
   wherein the substrate is spaced apart from the organic layer deposition assembly, and the substrate or the organic layer deposition assembly is configured to be moved relative to the other during deposition, and
   wherein the receiving member comprises:
   a first receiving member extending under a portion of a lower surface of the electrostatic chuck;
   a second receiving member above the first receiving member and extending over a portion of an upper surface of the electrostatic chuck; and
   a connection member connecting the first receiving member and the second receiving member to each other such that the substrate is exposed to the organic layer deposition assembly.

2. The organic layer deposition apparatus of claim 1, further comprising:
   a loading unit for fixing the substrate to the electrostatic chuck; and
   an unloading unit for separating the substrate on which deposition has been completed from the electrostatic chuck.

3. The organic layer deposition apparatus of claim 2, wherein the first conveyor unit is configured to sequentially move the electrostatic chuck to the loading unit, the deposition unit, and the unloading unit.

4. The organic layer deposition apparatus of claim 2, further comprising a second conveyor unit for returning the electrostatic chuck separated from the substrate, from the unloading unit to the loading unit.

5. The organic layer deposition apparatus of claim 1, wherein the guide unit comprises:
   a driving unit for generating a driving force to move the electrostatic chuck; and
   a magnetic levitation bearing for levitating the electrostatic chuck above the receiving member to move without contacting the receiving member.

6. The organic layer deposition apparatus of claim 5, wherein the driving unit comprises a linear motor.

7. The organic layer deposition apparatus of claim 6, wherein the linear motor comprises a magnetic rail disposed at a side of the electrostatic chuck between the upper and lower surfaces of the electrostatic chuck, and a coil disposed in the receiving member.

8. The organic layer deposition apparatus of claim 5, wherein the magnetic levitation bearing comprises a side magnetic levitation bearing disposed to face a side of the electrostatic chuck between the upper and lower surfaces of the electrostatic chuck, and an upper magnetic levitation bearing disposed to face an upper surface of the electrostatic chuck, and the driving unit is disposed to face a side of the electrostatic chuck between the upper and lower surfaces of the electrostatic chuck.

9. The organic layer deposition apparatus of claim 5, wherein the magnetic levitation bearing comprises a magnet selected from the group consisting of electromagnets, permanent magnets, superconducting magnets, and combinations thereof.

10. The organic layer deposition apparatus of claim 1, further comprising a gap sensor for measuring a gap interval between the receiving member and the electrostatic chuck.

11. The organic layer deposition apparatus of claim 10, further comprising a magnetic levitation bearing controlled by the gap sensor to provide a magnetic force for levitating the electrostatic chuck above the receiving member.

12. The organic layer deposition apparatus of claim 11, wherein the magnetic levitation bearing comprises a side magnetic levitation bearing disposed to face a side of the electrostatic chuck between the upper and lower surfaces of the electrostatic chuck, and an upper magnetic levitation bearing disposed to face an upper surface of the electrostatic chuck.

13. The organic layer deposition apparatus of claim 12, wherein the gap sensor comprising a first gap sensor for measuring a gap interval between the electrostatic chuck and the first conveyor unit along a first direction, and a second gap sensor for measuring a gap interval between the electrostatic chuck and the first conveyor unit along a second direction crossing the first direction.

14. The organic layer deposition apparatus of claim 1, further comprising:
    a first magnetic levitation bearing for levitating the electrostatic chuck to be spaced apart from the first conveyor unit along a first direction; and
    a second magnetic levitation bearing for levitating the electrostatic chuck to be spaced apart from the first conveyor unit along a second direction crossing the first direction.

15. The organic layer deposition apparatus of claim 1, wherein the receiving member comprises a receiving groove defined by the first receiving member, the second receiving member, and the connection member for accommodating a side of the electrostatic chuck.

16. The organic layer deposition apparatus of claim 1, wherein the organic layer deposition assembly comprises a plurality of organic layer deposition assemblies disposed in the chamber.

17. The organic layer deposition apparatus of claim 1, wherein the chamber comprises a first chamber and a second chamber interconnected with each other, and the organic layer deposition assembly comprises a plurality of organic layer deposition assemblies disposed in each of the first and second chambers.

18. The organic layer deposition apparatus of claim 1, wherein the organic layer deposition assembly comprises:
    a deposition source configured to discharge a deposition material;
    a deposition source nozzle unit disposed at a side of the deposition source and comprising a plurality of deposition source nozzles; and
    a patterning slit sheet disposed to face and spaced apart from the deposition source nozzle unit, having a plurality of patterning slits, and being smaller than the substrate.

* * * * *